(12) United States Patent
Ryoo et al.

(10) Patent No.: US 11,616,287 B2
(45) Date of Patent: Mar. 28, 2023

(54) ANTENNA APPARATUS AND ANTENNA MODULE

(71) Applicant: Samsung Electro-Mechanics Co., Ltd., Suwon-si (KR)

(72) Inventors: Jeong Ki Ryoo, Suwon-si (KR); Hong In Kim, Suwon-si (KR); Nam Ki Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 29 days.

(21) Appl. No.: 17/197,106

(22) Filed: Mar. 10, 2021

(65) Prior Publication Data

US 2021/0203059 A1    Jul. 1, 2021

Related U.S. Application Data

(63) Continuation of application No. 16/170,536, filed on Oct. 25, 2018, now Pat. No. 10,978,780.

(30) Foreign Application Priority Data

Jan. 24, 2018  (KR) .................. 10-2018-0008942
May 24, 2018  (KR) .................. 10-2018-0058866

(51) Int. Cl.
*H01Q 1/24*    (2006.01)
*H01Q 1/22*    (2006.01)
(Continued)

(52) U.S. Cl.
CPC .......... *H01Q 1/2283* (2013.01); *H01L 23/66* (2013.01); *H01Q 1/243* (2013.01); *H01Q 1/48* (2013.01);
(Continued)

(58) Field of Classification Search
CPC .......... H01Q 1/2283; H01Q 1/48; H01Q 1/38; H01Q 3/44; H01Q 9/0414; H01Q 15/008; H01Q 21/08; H01L 2223/6677
See application file for complete search history.

(56) References Cited

U.S. PATENT DOCUMENTS 9,030,360 B2 * 5/2015 Jerauld ................ H01Q 15/006
                                                        343/909
10,505,279 B2 * 12/2019 Celik .................... H01Q 9/0435
(Continued)

FOREIGN PATENT DOCUMENTS

JP    2001-267833 A    9/2001
JP    2007-243375 A    9/2007
(Continued)

OTHER PUBLICATIONS

Korean Office Action dated Nov. 25, 2019 in counterpart Korean Patent Application No. 10-2018-0058866 (5 pages in English and 4 pages in Korean).
(Continued)

*Primary Examiner* — Awat M Salih
(74) *Attorney, Agent, or Firm* — NSIP Law

(57) ABSTRACT

An antenna apparatus includes a ground pattern having a through-hole; an antenna pattern disposed above the ground pattern and configured to either one or both of transmit and receive a radio-frequency (RF) signal; a feed via penetrating through the through-hole and having one end electrically connected to the antenna pattern; and a meta member comprising a plurality of cells repeatedly arranged and spaced apart from each other, each of the plurality of cells comprising a plurality of conductive patterns, and at least one conductive via electrically connecting the plurality of conductive patterns to each other, wherein the meta member is disposed along at least portions of side boundaries of the
(Continued)

antenna pattern above the ground pattern, and extends above the antenna pattern.

20 Claims, 28 Drawing Sheets

(51) Int. Cl.
    *H01Q 1/48*     (2006.01)
    *H01Q 21/08*     (2006.01)
    *H01L 23/66*     (2006.01)
    *H01Q 3/44*     (2006.01)
    *H01Q 9/04*     (2006.01)
    *H01Q 21/29*     (2006.01)
    *H01Q 15/00*     (2006.01)

(52) U.S. Cl.
    CPC ............ *H01Q 3/44* (2013.01); *H01Q 9/0414* (2013.01); *H01Q 15/008* (2013.01); *H01Q 21/08* (2013.01); *H01Q 21/293* (2013.01); *H01L 2223/6677* (2013.01)

(56) References Cited

U.S. PATENT DOCUMENTS

| | | | |
|---|---|---|---|
| 2007/0285316 A1* | 12/2007 | Saily | H01Q 15/008 343/909 |
| 2010/0328178 A1 | 12/2010 | Cho et al. | |
| 2011/0045764 A1 | 2/2011 | Maruyama et al. | |
| 2011/0210905 A1* | 9/2011 | Maruyama | H01Q 15/008 343/912 |
| 2013/0003333 A1 | 1/2013 | Toyao et al. | |
| 2014/0028524 A1 | 1/2014 | Jerauld et al. | |
| 2016/0013558 A1* | 1/2016 | Hwang | H01Q 9/0414 343/906 |
| 2016/0141749 A1 | 5/2016 | Tagi et al. | |
| 2017/0222316 A1 | 8/2017 | Mizunuma et al. | |
| 2017/0331192 A1* | 11/2017 | Yang | H01Q 9/0414 |

FOREIGN PATENT DOCUMENTS

| | | |
|---|---|---|
| JP | 2008-283381 A | 11/2008 |
| JP | 2009-153095 A | 7/2009 |
| JP | 2012-34332 A | 2/2012 |
| JP | 2016-105584 A | 6/2016 |
| KR | 10-2010-0138709 A | 12/2010 |
| KR | 10-1367959 B1 | 2/2014 |
| WO | WO 2011/111313 A1 | 9/2011 |
| WO | WO 2016/063759 A1 | 4/2016 |

OTHER PUBLICATIONS

Japanese Office Action dated Oct. 4, 2022, in counterpart Japanese Patent Application No. 2018-206835 (6 pages in English, 4 pages in Japanese).

* cited by examiner

ANTENNA APPARATUS AND ANTENNA MODULE

CROSS-REFERENCE TO RELATED APPLICATION(S)

This application is a continuation of application Ser. No. 16/170,536 filed on Oct. 25, 2018, which claims the benefit under 35 USC § 119(a) of Korean Patent Application Nos. 10-2018-0008942 and 10-2018-0058866 filed on filed on Jan. 24, 2018 and May 24, 2018, respectively, in the Korean Intellectual Property Office, the entire disclosures of which are incorporated herein by reference for all purposes.

BACKGROUND

1. Field

This application relates to an antenna apparatus and an antenna module.

2. Description of Related Art

Data traffic of mobile communications tends to increase rapidly every year. Technology has been actively developed to support such rapidly increased data in real time on a wireless network. For example, applications such as a content creation of Internet of Thing (IoT) based data, augmented reality (AR), virtual reality (VR), live VR/AR combined with social networking service (SNS), autonomous driving, and sync view (real-time user view image transmission using ultrasmall camera) require communications (for example, 5th generation (5G) communications and millimeter wave (mmWave) band communications) supporting the transmission and reception of large amounts of data.

Therefore, recently, research into the mmWave communications including 5G communications has been actively conducted, and research into the commercialization/standardization of an antenna module for smoothly implementing mmWave communications has been actively conducted.

A radio-frequency (RF) signal in a high-frequency band (for example, 24 GHz, 28 GHz, 36 GHz, 39 GHz, or 60 GHz) is easily absorbed and lost in a transfer process, and communications quality may thus be rapidly deteriorated. Therefore, an antenna for communications in high-frequency bands requires a technical approach different from that of existing antenna technology, and may require the development of a special type of technology such as a separate power amplifier for realizing an antenna gain, an integration between an antenna and a radio-frequency integrated circuit (RFIC), and an effective isotropic radiated power (EIRP).

Conventionally, an antenna module providing a millimeter wave communications environment has used a structure in which an integrated circuit (IC) and an antenna are disposed on a board and are connected to each other by a coaxial cable to satisfy a high level of antenna performance (e.g., a transmission/reception rate, a gain, and a directivity) depending on a high frequency. However, such a structure reduces an amount of space available for the antenna, limits a degree of freedom of an antenna shape, increases an interference between the antenna and the IC, and increases a size and a cost of the antenna module.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an antenna apparatus includes a ground pattern having a through-hole; an antenna pattern disposed above the ground pattern and configured to either one or both of transmit and receive a radio-frequency (RF) signal; a feed via penetrating through the through-hole and having one end electrically connected to the antenna pattern; and a meta member including a plurality of cells repeatedly arranged and spaced apart from each other, each of the plurality of cells including a plurality of conductive patterns, and at least one conductive via electrically connecting the plurality of conductive patterns to each other, wherein the meta member is disposed along at least portions of side boundaries of the antenna pattern above the ground pattern, and extends above the antenna pattern.

The antenna apparatus may further include an upper coupling pattern disposed above the antenna pattern so that the upper coupling pattern at least partially overlaps the antenna pattern when viewed in a vertical direction perpendicular to the ground pattern.

The plurality of cells of the meta member may include a plurality of first cells spaced apart from the antenna pattern in a first lateral direction when viewed in the vertical direction, and a plurality of second cells spaced apart from the antenna pattern in a direction opposite to the first lateral direction when viewed in the vertical direction, and one end of the feed via may be electrically connected to the antenna pattern at a point offset from a center of the antenna pattern in a second lateral direction different from the first lateral direction.

The ground pattern may have a second through-hole, the antenna apparatus may further include a second feed via penetrating through the second through-hole and having one end electrically connected to the antenna pattern at a point offset from the center of the antenna pattern in the first lateral direction, and the plurality of cells of the meta member may further include a plurality of third cells spaced apart from the antenna pattern in the second lateral direction when viewed in the vertical direction, and a plurality of fourth cells spaced apart from the antenna pattern in a direction opposite to the second lateral direction when viewed in the vertical direction.

The plurality of first cells may be arranged in an a×n structure, the plurality of second cells may be arranged in a b×n structure, the plurality of third cells may be arranged in a c×n structure, the plurality of fourth cells may be arranged in a d×n structure, and n is a natural number, and a, b, c and d may be natural numbers greater than n.

The meta member may further include a plurality of first dummy cells disposed between a first end of the plurality of first cells and a first end of the plurality of third cells; a plurality of second dummy cells disposed between a second end of the plurality of first cells and a first end of the plurality of fourth cells; a plurality of third dummy cells disposed between a first end of the plurality of second cells and a second end of the plurality of third cells; and a plurality of fourth dummy cells disposed between a second end of the plurality of second cells and a second end of the plurality of fourth cells, and a size of each of the first to fourth dummy cells may be greater than a size of each of the first to fourth cells.

The meta member may extend above the antenna pattern to a same level as a level of the upper coupling pattern.

The meta member may be disposed so that a vertical spacing distance from the ground pattern to an uppermost conductive pattern of the plurality of conductive patterns is the same as a vertical spacing distance from the ground pattern to the upper coupling pattern, and a vertical spacing distance from the ground pattern to a lowermost conductive pattern of the plurality of conductive patterns is the same as a vertical spacing distance from the ground pattern to the antenna pattern.

The meta member may be disposed so that a vertical spacing distance from the ground pattern to at least one of the plurality of conductive patterns is smaller than the vertical spacing distance from the ground pattern to the upper coupling pattern and is greater than the vertical spacing distance from the ground pattern to the antenna pattern.

The meta member may be disposed so that a horizontal spacing distance between the plurality of cells and the antenna pattern when viewed in a vertical direction perpendicular to the ground pattern is smaller than a vertical spacing distance from the ground pattern to an uppermost conductive pattern of the plurality of conductive patterns, and is greater than a vertical spacing distance from the ground pattern to a lowermost conductive pattern of the plurality of conductive patterns.

The meta member may be disposed so that a horizontal spacing distance between the plurality of cells and the antenna pattern when viewed in a vertical direction perpendicular to the ground pattern is uniform and is greater than an interval between the plurality of cells.

The antenna pattern may have a polygonal patch shape, each of the plurality of conductive patterns may have a polygonal shape corresponding to the polygonal patch shape of the antenna pattern, and a length of a side of each of the plurality of conductive patterns may be smaller than a spacing distance from the ground pattern to an uppermost conductive pattern of the plurality of conductive patterns, and may be greater than a spacing distance from the ground pattern to a lowermost conductive pattern of the plurality of conductive patterns.

The meta member may be disposed so that a spacing distance from a lowermost conductive pattern of the plurality of conductive patterns to the ground pattern is greater than a spacing from an uppermost conductive pattern of the plurality of conductive patterns to the lowermost conductive pattern of the plurality of conductive patterns.

The antenna apparatus may further include a plurality of first shielding vias electrically connected to the ground pattern and arranged to surround at least portions of the meta member when viewed in a vertical direction perpendicular to the ground pattern.

The antenna apparatus may further include a plurality of second shielding vias electrically connected to the ground pattern and arranged to surround the through-hole when viewed in the vertical direction.

The ground pattern may overlap a space between the meta member and the antenna pattern and at least portions of the antenna pattern and the meta member when viewed in a vertical direction perpendicular to the ground pattern.

The plurality of cells may be arranged to have a negative refractive index for the RF signal.

In another general aspect, an antenna module includes a connection member including a plurality of wirings, a ground pattern disposed above the plurality of wirings, and a plurality of wiring vias electrically connected to the plurality of wirings below the plurality of wirings; an integrated circuit (IC) electrically connected to the wiring vias and disposed below the connection member; and a plurality of antenna apparatuses electrically connected to the plurality of wirings and disposed above the connection member, wherein at least one of the plurality of antenna apparatuses includes an antenna pattern configured to either one or both of transmit and receive a radio-frequency (RF) signal; an upper coupling pattern disposed above the antenna pattern so that the upper coupling pattern at least partially overlaps the antenna pattern when viewed in a vertical direction perpendicular to the ground pattern; a first feed via having one end electrically connected to the antenna pattern at a point offset from a center of the antenna pattern in a second lateral direction; a second feed via having one end electrically connected to the antenna pattern at a point offset from the center of the antenna pattern in a first lateral direction; and a meta member including a plurality of conductive patterns arranged to have a negative refractive index for the RF signal and surrounding the antenna pattern when viewed in the vertical direction.

The connection member may further include a second antenna pattern electrically connected to the plurality of wirings and configured to either one or both of transmit and receive an RF signal in a direction different from a direction in which the antenna pattern is configured to either one or both of transmit and receive an RF signal.

The antenna module may further include a support member disposed below the connection member, having a height greater than a height of the IC, and including core vias electrically connected to wirings not electrically connected to the plurality of antenna apparatuses among the plurality of wirings; and electrical connection structures disposed below the support member and electrically connected to the core vias.

In another general aspect, an antenna apparatus includes a ground pattern; an antenna pattern disposed above the ground pattern and configured to transmit a radio-frequency (RF) signal; and a meta member disposed above the ground pattern along at least portions of side boundaries of the antenna pattern and extending above the antenna pattern in a vertical direction perpendicular to the ground pattern, wherein the meta member is configured to either one or both of change a propagation direction of a first portion of the RF signal leaking from the antenna pattern to the meta member in a lateral direction to substantially the vertical direction, and change a propagation direction of a second portion of the RF signal incident on the ground pattern and reflected to the meta member to substantially the vertical direction.

The antenna apparatus may further include an upper coupling pattern disposed above the antenna pattern at substantially a same level as an upper end of the meta member.

The meta member may have a negative refractive index for the RF signal.

The meta member may include a plurality of cells repeatedly arranged and spaced apart from each other, and each of the plurality of cells may include a plurality of conductive patterns, and at least one conductive via electrically connecting the plurality of conductive patterns to each other.

In another general aspect, an antenna apparatus includes a ground pattern; an antenna pattern disposed above the ground pattern and configured to either one or both of transmit and receive a radio-frequency (RF) signal; a meta member having a negative refractive index for the RF signal and disposed above the ground pattern along at least portions of two opposite side boundaries of the antenna pattern; and a feed via electrically connected to the antenna pattern at a point offset from a center of the antenna pattern in a direction substantially parallel to the two opposite side boundaries of the antenna pattern.

The antenna apparatus may further include an upper coupling pattern disposed above the antenna pattern, and the meta member may extend from substantially a same level as the antenna pattern to substantially a same level as the upper coupling pattern.

The meta member may include a plurality of cells repeatedly arranged and spaced apart from each other, and each of the plurality of cells may include a plurality of conductive patterns, and at least one conductive via electrically connecting the plurality of conductive patterns to each other.

A length of a side of each of the plurality of conductive patterns may be smaller than a spacing distance from the ground pattern to an uppermost conductive pattern of the plurality of conductive patterns, and may be greater than a spacing distance from the ground pattern to a lowermost conductive pattern of the plurality of conductive patterns.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
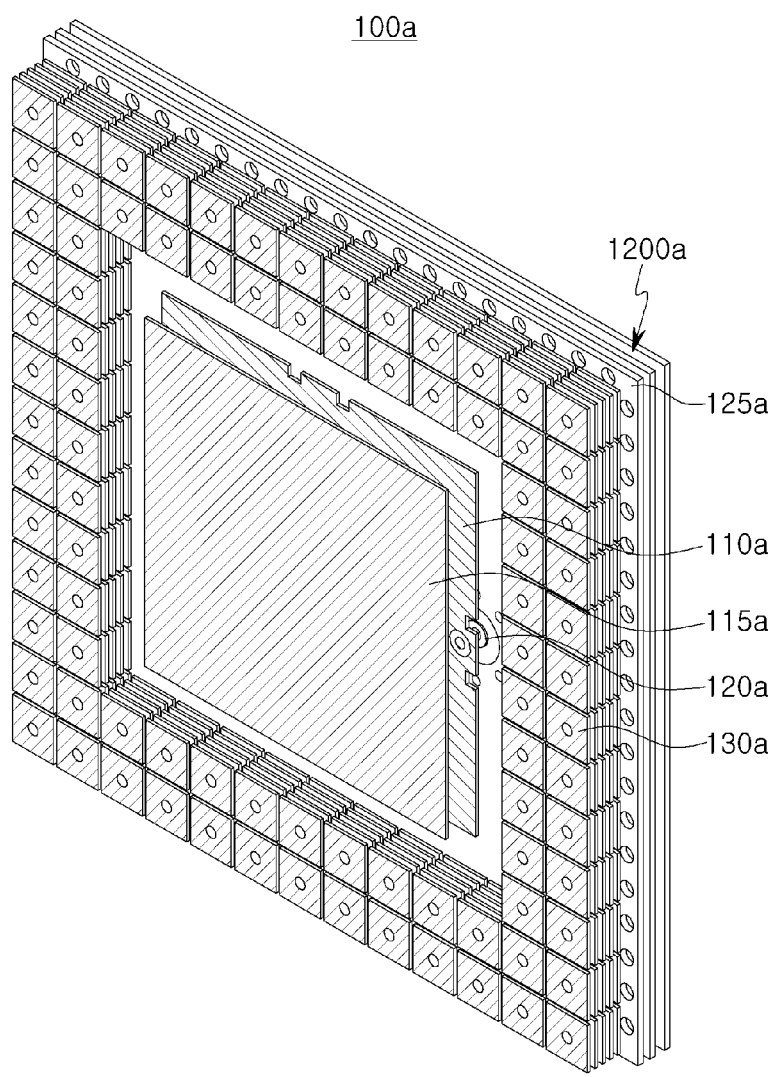
FIG. 1 is a perspective view illustrating an example of an antenna apparatus.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has"

specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a perspective view illustrating an example of an antenna apparatus.

Referring to FIG. 1, an antenna apparatus 100a includes an antenna pattern 110a, a feed via 120a, a ground pattern 125a, and a meta member 130a. In this application, a vertical direction is a direction perpendicular to an upper surface and/or a lower surface of the ground pattern 125a, and an upper level and a lower level are defined based on the vertical direction.

The antenna pattern 110a is configured to receive a radio-frequency (RF) signal from an over-the-air transmission and transfer the RF signal to the feed via 120a or receive an RF signal from the feed via 120a and transmit the RF signal in an over-the-air transmission. The antenna pattern 110a has an inherent frequency band (for example, 28 GHz) depending on inherent elements (for example, a shape, a size, a height, and a dielectric constant of an insulating layer).

In one example, the antenna pattern 110a has a structure of a patch antenna having opposing surfaces with a circular shape or a polygonal shape. The opposing surfaces of the patch antenna serve as a boundary between a conductor and a non-conductor through which the RF signal is propagated.

The feed via 120a transfers the RF signal received from the antenna pattern 110a to an integrated circuit (IC), and transfers an RF signal received from the IC to the antenna pattern 110a.

For example, the number of feed vias 120a electrically connected to one antenna pattern may be two or more. When the number of feed vias 120a is two more, the feed vias 120a may be configured so that RF signals having different phases (for example, a phase difference of 90° and a phase difference of 180°) pass therethrough, respectively, may be configured so that RF signals pass therethrough at different points in time, respectively, and may be configured so that an RF signal to be transmitted and a received RF signal pass therethrough, respectively. The phase difference between the RF signals may be implemented through a phase shifter of the IC or be implemented through a difference in an electrical length between wirings.

The ground pattern 125a is disposed below the antenna pattern 110a, and has at least one through-hole. The feed via 120a is disposed to penetrate through the at least one through-hole.

The ground pattern 125a is disposed to block a space between the antenna pattern 110a of an upper side and a connection member 1200a of a lower side to improve an isolation level between the antenna pattern 110a and the connection member 1200a. In addition, the ground pattern 125a provides a capacitance depending on an electromagnetic coupling with the antenna pattern 110a to the antenna pattern 110a. In addition, the ground pattern 125a reflects the RF signal of the antenna pattern 110a to further concentrate the RF signal in an upward direction, and thus improves an antenna performance of the antenna pattern 110a.

The meta member 130a has a structure in which a plurality of cells respectively including a plurality of conductive patterns smaller than the antenna pattern 110a and at least one via electrically connecting the plurality of conductive patterns to each other are repeatedly arranged and spaced apart from each other. Therefore, the meta member 130a has an electromagnetic bandgap structure, and thus has a negative refractive index for the RF signal.

The meta member 130a is spaced apart from the upper surface of the ground pattern 125a so that the meta member 130a does not overlap the antenna pattern 110a when viewed in the vertical direction, and is disposed so that a spacing distance from a midpoint of the meta member 130a to the ground pattern 125a is greater than a spacing distance between the antenna pattern 110a and the ground pattern 125a. That is, the meta member 130a is disposed along at least portions of side boundaries of the antenna pattern 110a above the ground pattern 125a, and extends to a higher level as compared to the antenna pattern 110a.

Therefore, the meta member 130a further concentrates the RF signal of the antenna pattern 110a in the upward direction by more efficiently using the negative refractive index, and thus further improves the antenna performance of the antenna pattern 110a.

Figure 7:
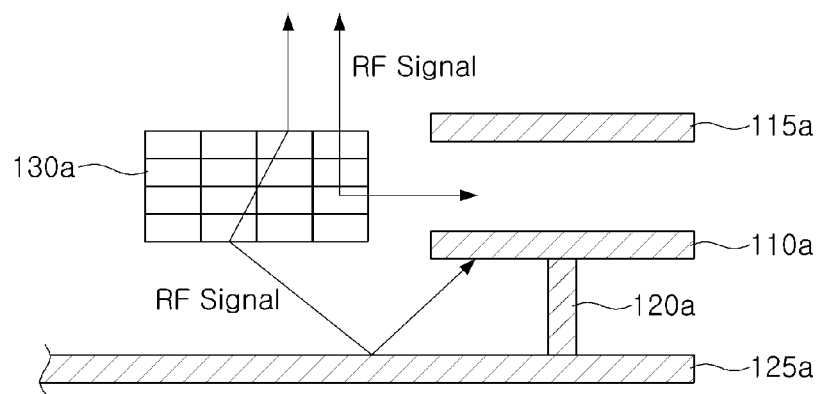
FIG. 7 is a side view illustrating an example of a radio-frequency (RF) signal propagation path of the antenna apparatus.

FIG. 7 is a side view illustrating an example of a radio-frequency (RF) signal propagation path of the antenna apparatus.

Referring to FIG. 7, the ground pattern 125a reflects the RF signal incident from the antenna pattern 110a. The reflected RF signal propagates through the meta member 130a. A direction of a side vector of the RF signal propagating through the meta member 130a is changed to an opposite direction by the negative refractive index of the meta member 130a. Therefore, the RF signal propagating through the meta member 130a is concentrated in the upward direction.

The meta member 130a is electromagnetically coupled to the antenna pattern 110a, and influences frequency characteristics of the antenna pattern 110a depending on elements of the meta member 130a (for example, a height, a shape of a metal plate, a size of the metal plate, a number of metal plates, an interval between a plurality of metal plates, and a spacing distance from the antenna pattern).

Therefore, the antenna pattern 110a has an extended frequency band (for example, 26 GHz or 38 GHz). When the extended frequency band is adjacent to the inherent frequency band of the antenna pattern 110a, the antenna pattern 110a has a wide bandwidth. When the extended frequency band is not adjacent to the inherent frequency band, the antenna pattern 110a has a capability of performing dual-band transmission and reception.

Referring to FIG. 1, the antenna apparatus 100a further includes an upper coupling member 115a spaced apart from an upper surface of the antenna pattern 110a. The upper coupling member 115a provides a capacitance depending on an electromagnetic coupling between the upper coupling member 115a and the antenna pattern 110a to the antenna pattern 110a, and increases an RF signal transmission and reception area of the antenna pattern 110a. Therefore, a gain or a bandwidth of the antenna pattern 110a is improved.

An optimal position for connection of the feed via 120a in the antenna pattern 110a may be spaced apart from the center of the antenna pattern 110a depending on a disposition of the upper coupling member 115a.

Figure 3A:
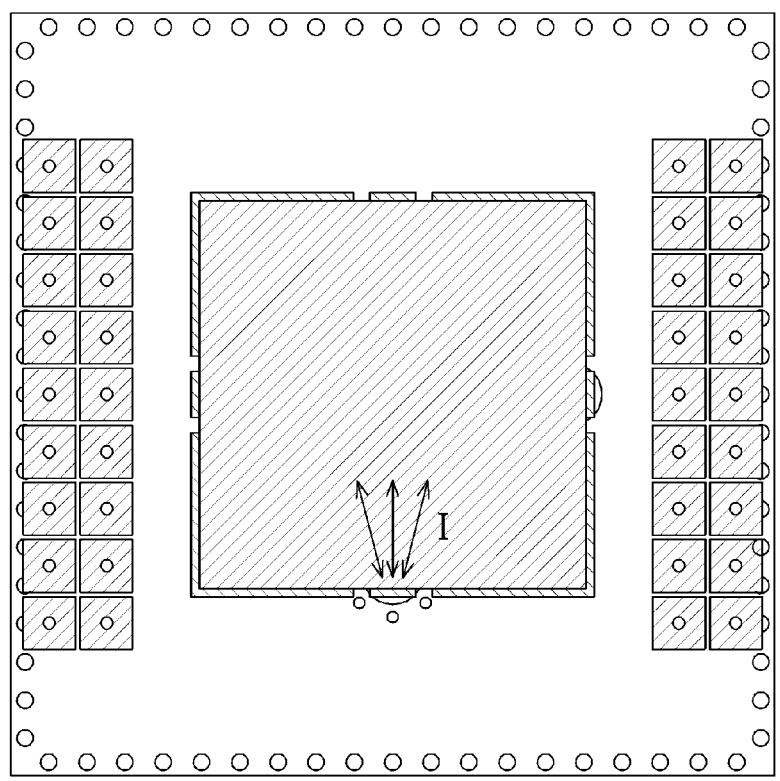
FIGS. 3A and 3B are plan views illustrating an example of a meta member corresponding to a surface current flow of the antenna apparatus.
Figure 3B:
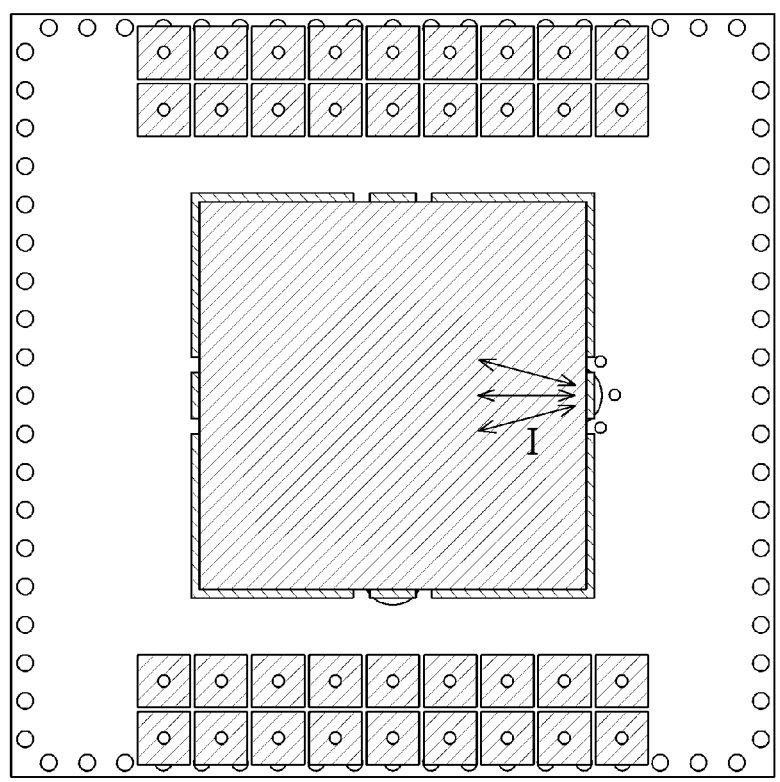

FIGS. 3A and 3B are plan views illustrating an example of a meta member corresponding to a surface current flow of the antenna apparatus.

Referring to FIG. 3A, when the optimal position is close to an edge of the antenna pattern 110a in a second lateral direction (for example, a direction 270°) of the antenna pattern 110a, a surface current flowing in the antenna pattern 110a depending on RF signal transmission and reception of the antenna pattern 110a flows in a fourth lateral direction (for example, a direction of 90°) of the antenna pattern 110a. In this case, the surface current is dispersed in a first lateral direction (for example, a direction of 0°) and a third lateral direction (for example, a direction of 180°), and the meta member 130a suppresses an RF signal depending on components of the surface current dispersed in the first and third lateral directions from leaking in the first and third lateral directions.

Referring to FIG. 3B, when the optimal position is close to an edge of the antenna pattern 110a in the first lateral direction (for example, the direction 0°) of the antenna pattern 110a, a surface current flowing in the antenna pattern 110a depending on RF signal transmission and reception of the antenna pattern 110a flows in the third lateral direction (for example, the direction of 180°) of the antenna pattern 110a. In this case, the surface current is dispersed in the second lateral direction (for example, the direction of 270°) and the fourth lateral direction (for example, the direction of 90°), and the meta member 130a suppresses an RF signal depending on components of the surface current dispersed in the second and fourth lateral directions from leaking in the second and fourth lateral directions.

Therefore, the meta member 130a surrounding the antenna pattern 110a and/or the upper coupling member 115a suppresses the RF signal of the antenna pattern 110a from leaking in a lateral direction, and thus further improves the antenna performance of the antenna pattern 110a.

FIGS. 2A through 2E are plan views illustrating examples of various structures of the antenna apparatus.

Figure 2A:
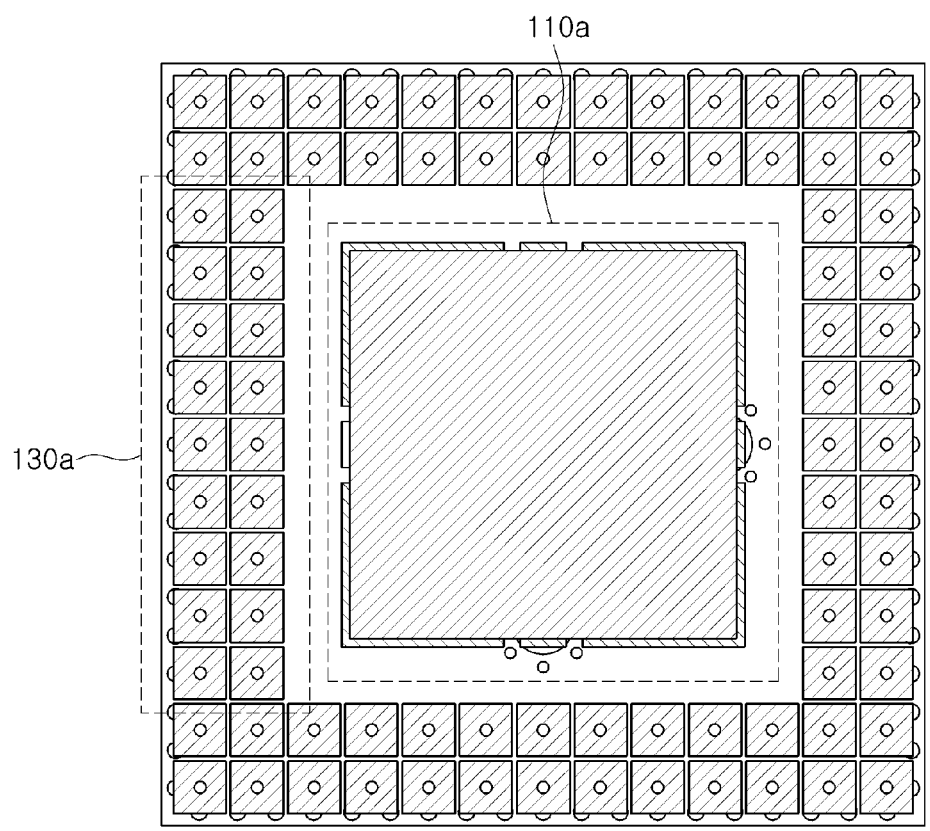
FIGS. 2A through 2E are plan views illustrating examples of various structures of the antenna apparatus.

Referring to FIG. 2A, the meta member 130a completely surrounds the antenna pattern 110a when viewed in the vertical direction, and is disposed so that a spacing distance between the meta member 130a and the antenna pattern 110a is uniform. Therefore, the meta member 130a is able to efficiently suppress the RF signal of the antenna pattern 110a from leaking in the lateral direction, and efficiently concentrate the RF signal reflected from the ground pattern in the upward direction.

Figure 2B:
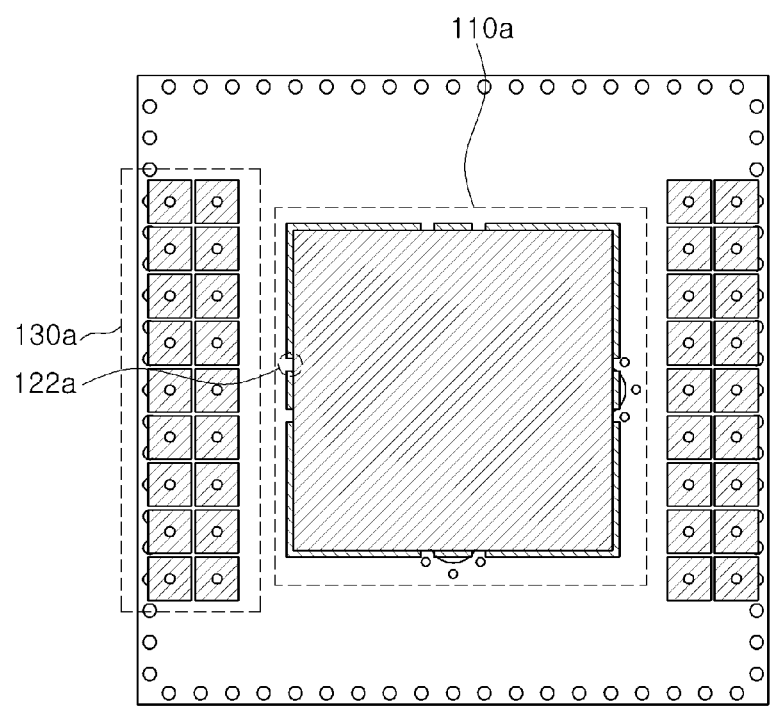
Figure 2C:
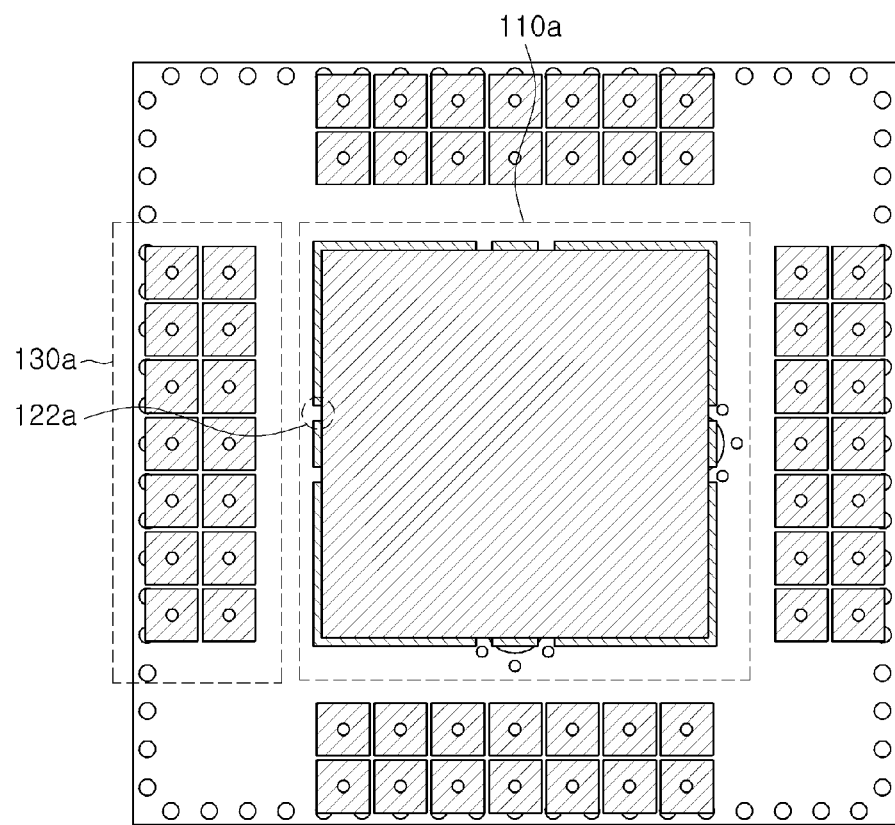

Referring to FIGS. 2B and 2C, the meta member 130a only partially surrounds the antenna pattern 110a. Therefore, in the antenna apparatus of this example, the antenna performance is improved using the negative refractive index of the meta member 130a, and an increase in a size of the antenna apparatus due to the use of the meta member 130a is reduced.

Figure 2D:
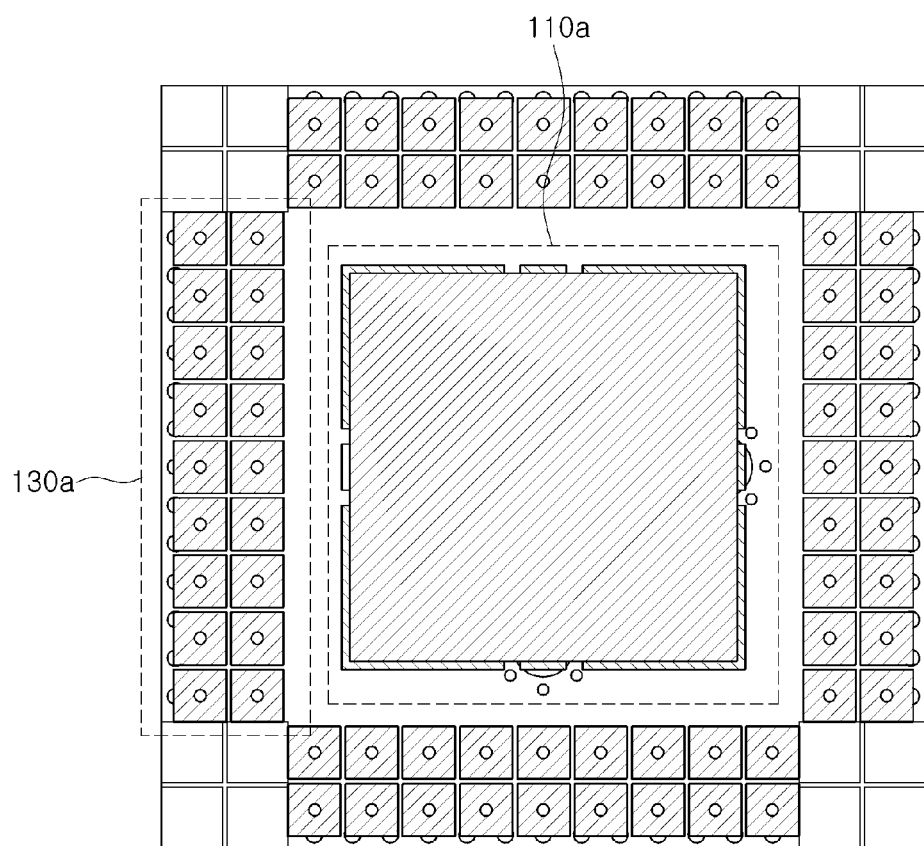

Referring to FIG. 2D, the meta member 130a further include a plurality of dummy cells disposed adjacent to vertices of a polygon enclosing the meta member 130a. In addition, a size of a conductive pattern of each of the plurality of dummy cells is greater than a of the conductive patterns of the meta member. Therefore, the antenna apparatus of this example may be easily coupled to a meta member of an adjacent antenna apparatus in an antenna module without influencing the negative refractive index characteristics of the meta member 130a. Therefore, the antenna apparatus of this example improves an antenna performance when used in an array.

Referring to FIGS. 2A through 2D, the antenna pattern 110a includes slits 122a formed adjacent to points to which the feed vias are connected and on opposite sides the antenna pattern 110a. The slits 122a influence an impedance of the antenna pattern 110a, and induce the surface current flowing in the antenna pattern 110a to flow from a slit on one side of the antenna pattern 110a to a slit on the other side of the antenna pattern 110a. Therefore, the RF signal leaking from the antenna pattern 110a in the lateral direction may be reduced.

Figure 2E:
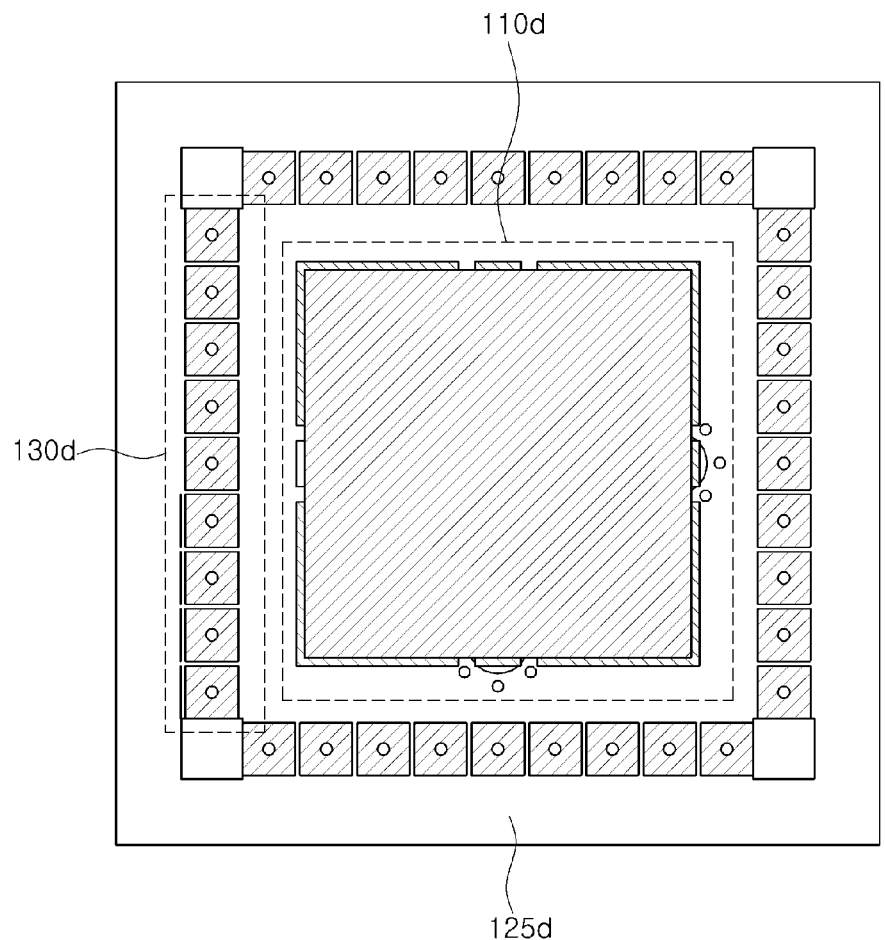

Referring to FIG. 2E, the antenna apparatus of this example includes an antenna pattern 110d, a ground pattern 125d, and a meta member 130d. A plurality of cells included in the meta member 130d are arranged in an n×1, structure, where n is a natural number larger than 2. That is, the plurality of cells are arranged in one string. Therefore, a size of the antenna apparatus of this example is reduced.

Figure 4A:
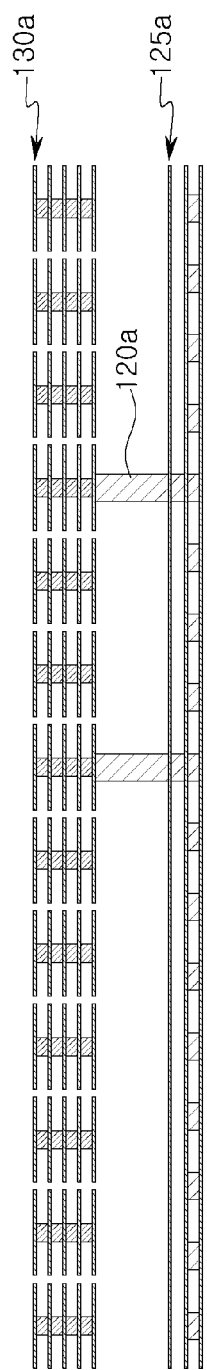
FIGS. 4A and 4B are side views illustrating examples of various structures of the antenna apparatus.
Figure 4B:
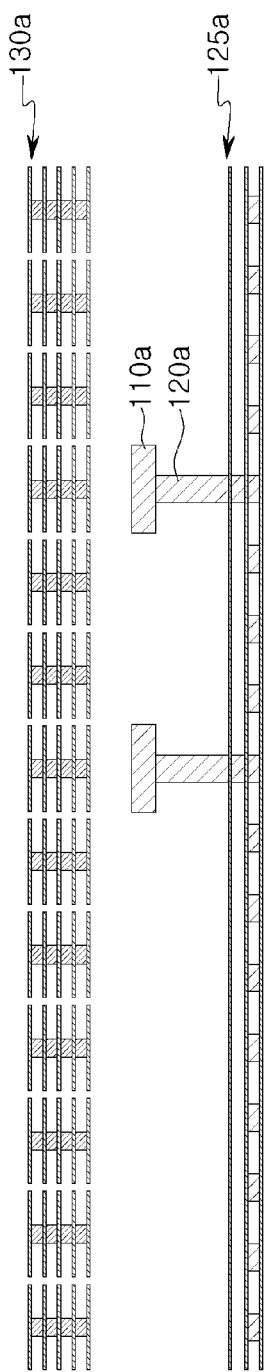

FIGS. 4A and 4B are side views illustrating examples of various structures of the antenna apparatus.

Referring to FIG. 4A, a lower level conductive pattern of the meta member 130a is disposed at the same height as a height of the antenna pattern. Therefore, a spacing distance from the midpoint of the meta member 130a to the ground pattern 125a is greater than a spacing distance from the antenna pattern 110a to the ground pattern 125a.

Referring to FIG. 4B, all of the conductive patterns of the meta member 130a are disposed at a height higher than a height of the antenna pattern 110a. The height of the meta member 130a may be changed depending on a frequency of the RF signal, an antenna performance design condition, the number of antenna apparatuses included in the antenna module, intervals between the antenna apparatuses, and sizes of the antenna apparatuses.

Figure 5A:
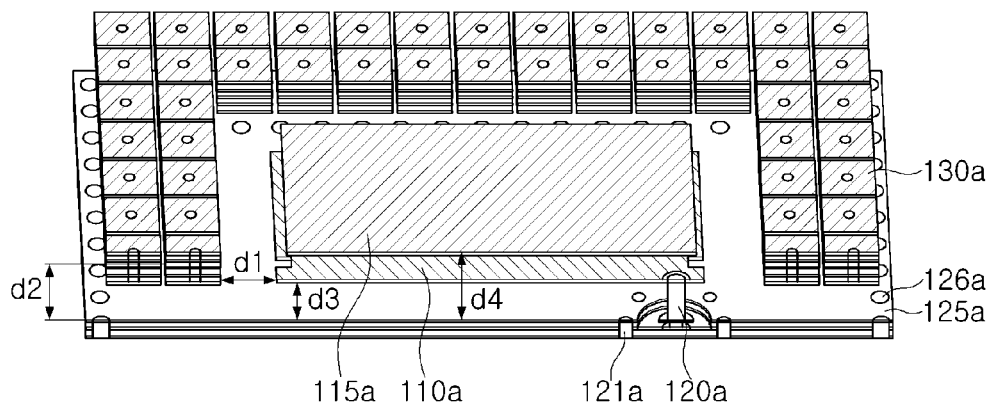
FIG. 5A is a perspective view illustrating an example of a cross section of the antenna apparatus.

FIG. 5A is a perspective view illustrating an example of a cross section of the antenna apparatus.

Referring to FIG. 5A, the ground pattern 125a overlaps at least portions of the meta member 130a and at least portions of the antenna pattern 110a so as to cover a space between the meta member 130a and the antenna pattern 110a when viewed in the vertical direction. Therefore, the ground pattern 125a is able to more efficiently reflect the RF signal of the antenna pattern 110a to the meta member 130a, and so the antenna performance of the antenna apparatus of this example is improved.

Referring to FIG. 5A, the meta member 130a is disposed so that an average spacing distance d2 from the ground pattern 125a to the plurality of conductive patterns included in the meta member 130a is greater than a spacing distance d3 from the ground pattern 125a to the antenna pattern 110a and is smaller than a spacing distance d4 from the ground pattern 125a to the upper coupling pattern 115a. Therefore, the RF signal reflected from the ground pattern 125a is propagated through the meta member 130a at an appropriate angle at which it is concentrated in the upward direction in the meta member 130a. Therefore, the antenna performance of the antenna apparatus of this example is improved.

Referring to FIG. 5A, the meta member 130a is disposed so that a spacing distance from the ground pattern 125a to the uppermost conductive pattern of the plurality of conductive patterns included in the meta member 130a is substantially the same as the spacing distance d4 from the ground pattern 125a to the upper coupling pattern 115a, and a spacing distance from the ground pattern 125a to the lowermost conductive pattern of the plurality of conductive patterns included in the meta member 130a is substantially the same as the spacing distance d3 from the ground pattern 125a to the antenna pattern 110a. That is, the meta member 130a is disposed along at least portions of the side boundaries of the antenna pattern 110a, and extends to the same height as the height of the upper coupling pattern 115a. Therefore, the meta member 130a is able to more efficiently induce the RF signal leaking from the antenna pattern 110a and the upper coupling pattern 115a in the lateral direction to propagate in the upward direction.

Referring to FIG. 5A, the meta member 130a is disposed so that a spacing distance from the ground pattern to at least one of the plurality of conductive patterns included in the meta member 130a (for example, a conductive pattern at a midpoint) is smaller than the spacing distance d4 from the ground pattern 125a to the upper coupling pattern 115a and is greater than the spacing distance d3 from the ground pattern 125a to the antenna pattern 110a. At least one of the plurality of conductive patterns included in the meta member 130a physically blocks the antenna pattern 110a and the upper coupling pattern 115a from an antenna pattern and an upper coupling pattern of another antenna apparatus in the antenna module. Therefore, an isolation level between the antenna apparatus of this example and an adjacent antenna apparatus is improved.

Referring to FIG. 5A, the meta member 130a is disposed so that a spacing distance d1 from the antenna pattern 110a to the plurality of conductive patterns included in the meta member 130a is smaller than the spacing distance d4 from the ground pattern 125a to the upper coupling pattern 115a and is greater than the spacing distance d3 from the ground pattern 125a to the antenna pattern 110a. Therefore, the RF signal reflected from the ground pattern 125a is propagated through the meta member 130a at an appropriate angle at which it is concentrated in the upward direction in the meta member 130a. Therefore, the antenna performance of the antenna apparatus of this example is improved.

Referring to FIG. 5A, a length of a side of each of the plurality of conductive patterns included in the meta member 130a is smaller than the spacing distance from the ground pattern 125a to the uppermost conductive pattern of the plurality of conductive patterns and is greater than the spacing distance from the ground pattern 125a to the lowermost conductive pattern of the plurality of conductive patterns. In addition, the spacing distance from the lowermost conductive pattern of the meta member 130a to the ground pattern 125a is greater than the spacing distance from the uppermost conductive pattern to the lowermost conductive pattern of the plurality of conductive patterns included in the meta member 130a. Therefore, the meta member 130a has an appropriate negative refractive index so that the RF signal propagated through the meta member 130a is concentrated in the upward direction. Therefore, the antenna performance of the antenna apparatus of this apparatus is improved.

Referring to FIG. 5A, the antenna apparatus further includes a plurality of first shielding vias 126a electrically connected to the ground pattern 125a and arranged to surround at least portions of the meta member 130a when viewed in the vertical direction. Therefore, an isolation level between the antenna apparatus of this example and an adjacent antenna apparatus is improved, and an RF signal reflection performance of the ground pattern 125a is further improved.

In addition, referring to FIG. 5A, the antenna apparatus further includes a plurality of second shielding vias 121a electrically connected to the ground pattern 125a and arranged to surround the feed via 120a when viewed in the vertical direction. Therefore, an electromagnetic noise of the RF signal passing through the feed via 120a is reduced.

Figure 5B:
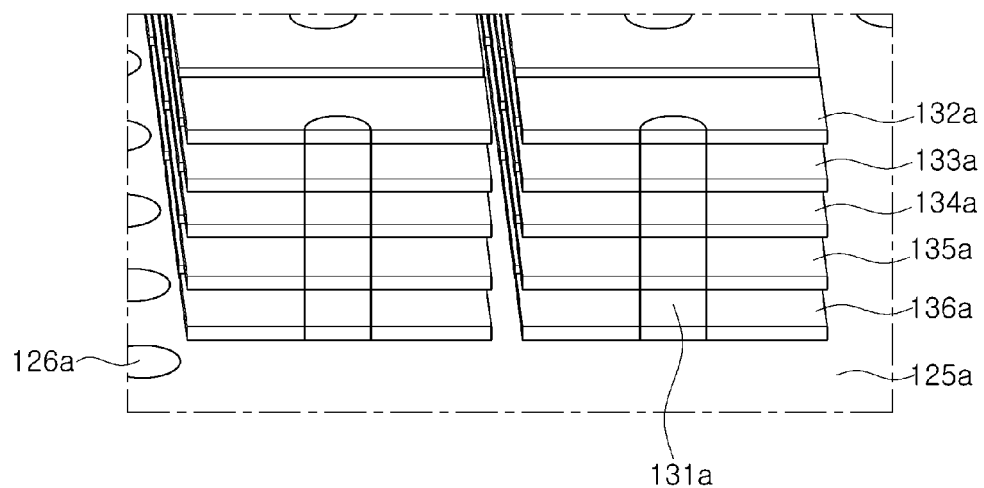
FIG. 5B is a perspective view illustrating an example of a cross section of the meta member of the antenna apparatus.
Figure 6A:
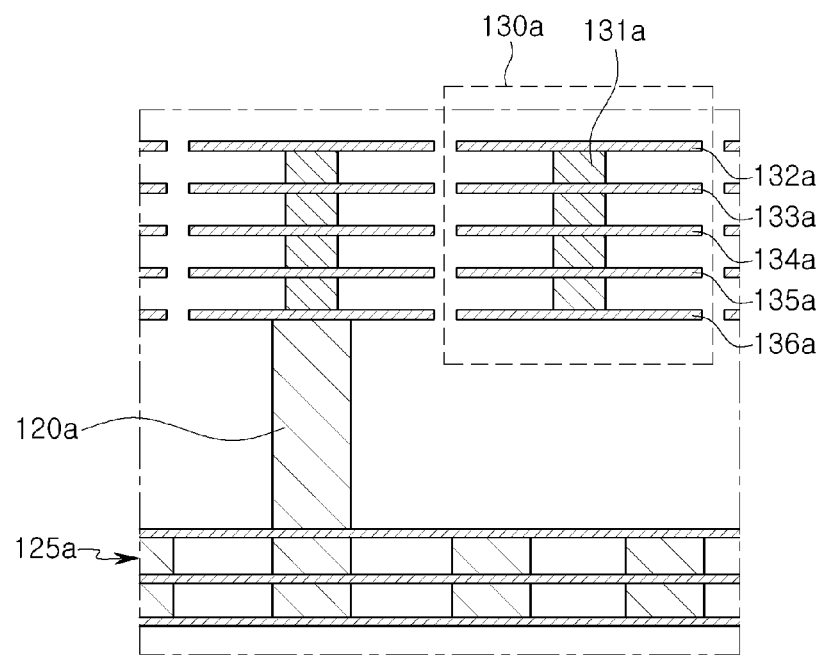
FIGS. 6A and 6B are side views illustrating examples of various structures of the meta member of the antenna apparatus.
Figure 6B:
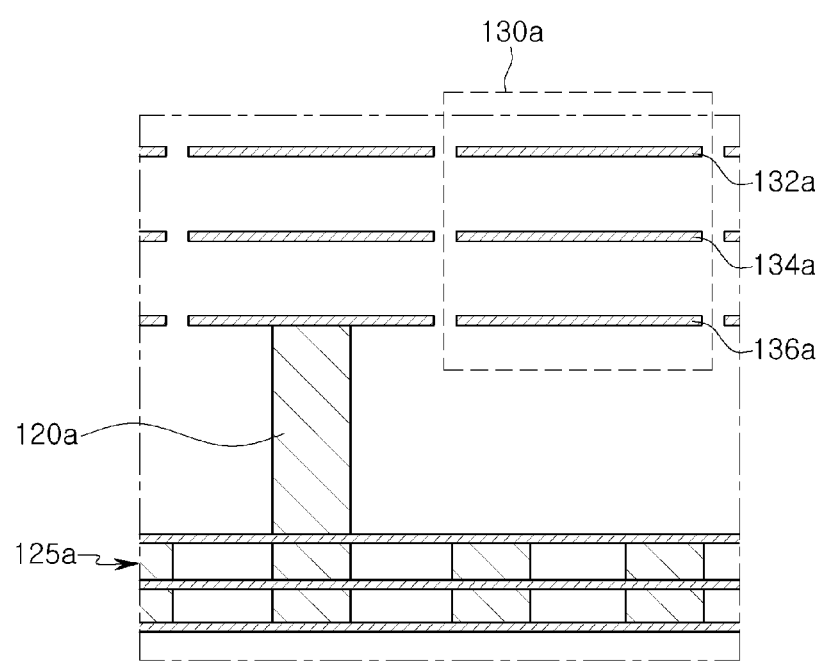

FIG. 5B is a perspective view illustrating an example of a cross section of the meta member of the antenna apparatus, and FIGS. 6A and 6B are side views illustrating examples of various structures of the meta member of the antenna apparatus.

Referring to FIGS. 5B and 6A, each of the plurality of cells included in the meta member 130a includes a conductive via 131a, a first conductive pattern 132a, a second conductive pattern 133a, a third conductive pattern 134a, a fourth conductive pattern 135a, and a fifth conductive pattern 136a.

Referring to FIG. 5B, the plurality of cells are arranged in an n×2 structure, where n is a natural number larger than 2. That is, the plurality of cells are arranged in two strings. The RF signal leaking from the antenna pattern in the lateral direction is propagated as if it is incident to a medium having a negative refractive index by a narrow gap between one of the two strings that is adjacent to the antenna pattern and the other one of the two strings that is further away from the antenna pattern. Therefore, the plurality of cells arranged in the n×2 structure further concentrate the RF signal in the upward direction. However, structure of the plurality of cells is not limited to the n×2 structure, but may be changed depending on a design. For example, the plurality of cells may be arranged in the n×1 structure illustrated in FIG. 2E.

The conductive vias 131a electrically connect the first to fifth conductive patterns 132a, 133a, 134a, 135a, and 136a to each other, and improve the structural stability of the first to fifth conductive patterns 132a, 133a, 134a, 135a, and 136a.

In addition, since the conductive via 131a physically blocks the antenna pattern 110a and the upper coupling pattern 115a from an antenna pattern and an upper coupling pattern of another antenna apparatus in the antenna module, the conductive via 131a improves an isolation level between the antenna apparatus of this example and an adjacent antenna apparatus.

Since the first to fifth conductive patterns 132a, 133a, 134a, 135a, and 136a have shapes and sizes that are substantially the same as one another and are spaced apart from each other by intervals that are substantially the same as one another, the meta member 130a has electromagnetic bandgap characteristics (i.e., a negative refractive index).

FIG. 6B differs from FIGS. 5B and 6A in that the meta member 30 in FIG. 6B only includes the first, third, and fifth conductive members 132a, 134a, and 136a.

Although FIGS. 6A and 6B appear to show that the feed via 120a is connected to the meta member 130a, this is not the case. The feed via 120a is actually connected to the antenna pattern 110a, which is behind the meta member 130a and is blocked from view.

Figure 8A:
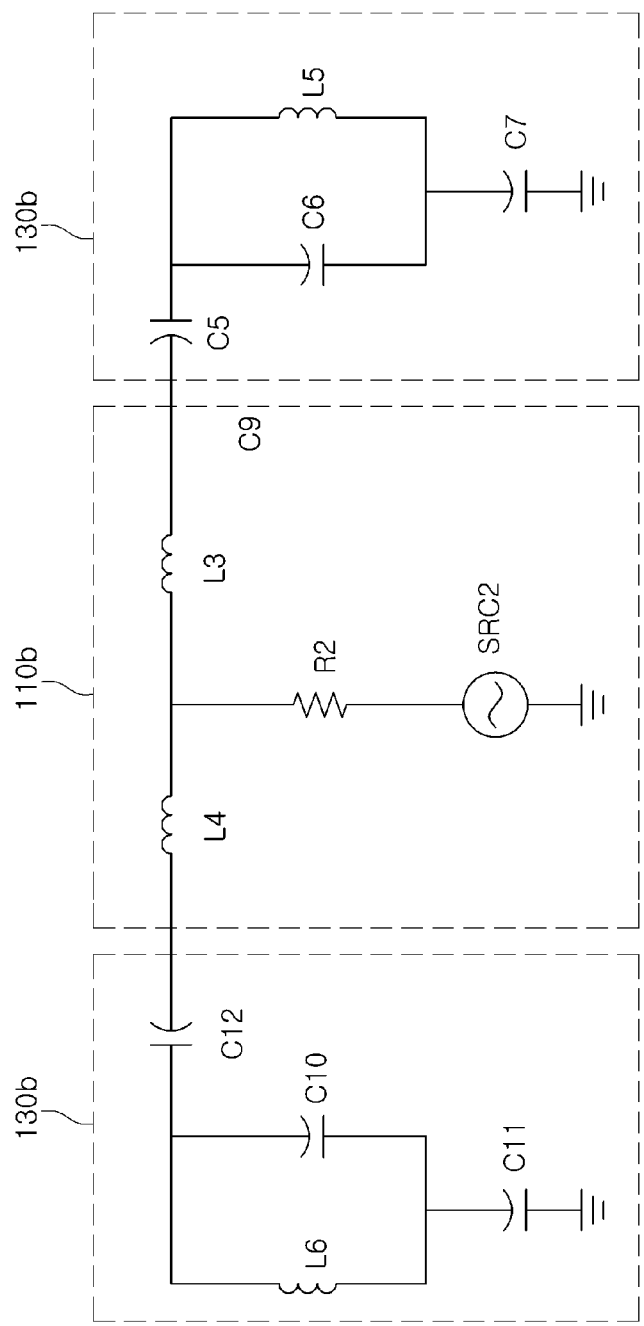
FIG. 8A is a circuit diagram illustrating an example of an equivalent circuit of the antenna apparatus.

FIG. 8A is a circuit diagram illustrating an example of an equivalent circuit of the antenna apparatus.

Referring to FIG. 8A, an antenna pattern 110b of the antenna apparatus transfers an RF signal to a source SRC2 such as an IC or receives an RF signal transferred from the source SRC2, and has a resistance R2 and inductances L3 and L4.

A meta member 130b has capacitances C5 and C12 for the antenna pattern 110b, capacitances C6 and C10 between a plurality of conductive patterns, inductances L5 and L6 of conductive vias, and capacitances C7 and C11 between the conductive patterns and a ground pattern.

A frequency band and a bandwidth of the antenna apparatus is determined by the resistance, the capacitances, and the inductances described above.

The capacitances C7 and C11 between the conductive patterns and the ground pattern may be replaced by inductances depending on whether or not the meta member 130b and the ground pattern are electrically connected to each other. That is, the antenna apparatus may further include vias electrically connecting the conductive patterns of the meta member 130b and the ground pattern to each other.

When the antenna apparatus does not include the vias electrically connecting the meta member 130b and the ground pattern to each other, the meta member 130b acts adaptively to a frequency of the RF signal. Therefore, the antenna apparatus has an increased bandwidth.

Figure 8B:
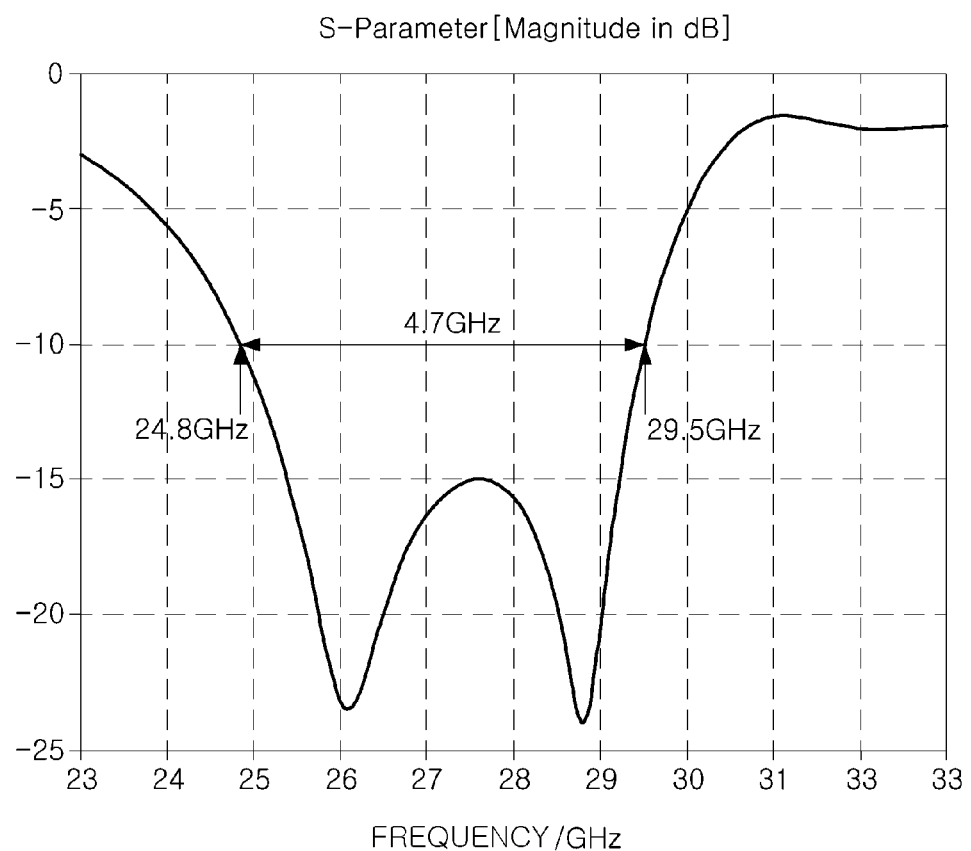
FIG. 8B is a graph illustrating an example of an S-parameter of the antenna apparatus.

FIG. 8B is a graph illustrating an example of an S-parameter of the antenna apparatus.

Referring to FIG. 8B, the S-parameter (for example, a ratio of an energy of the RF signal transferred from the antenna pattern to the feed via to an energy of the RF signal transferred from the feed via to the antenna pattern) of the antenna apparatus has a low value at about 26 GHz and about 28 GHz. That is, since the reflectivities of an RF signal of about 26 GHz and an RF signal of about 28 GHz in a transmission process are low, the antenna pattern has a high antenna performance for the RF signal of about 26 GHz and the RF signal of about 28 GHz.

When a reference for measuring a bandwidth is set to an S-parameter of −10 dB, the antenna module of this example has a bandwidth of about 4.7 GHz.

The low value of the S-parameter at about 28 GHz is determined by the inherent elements of the antenna pattern, and the low value of the S-parameter at about 26 GHz is determined by the elements of the meta member. That is, the antenna apparatus of this example further increases the bandwidth using the meta member.

Figure 9A:
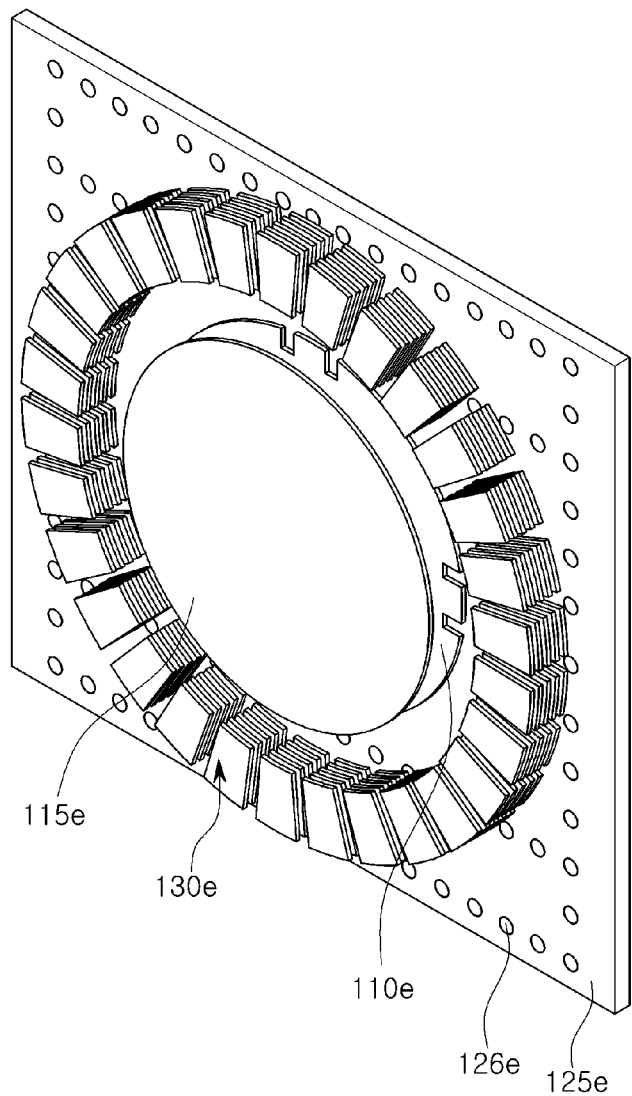
FIGS. 9A and 9B are respectively a perspective view and a plan view illustrating an example of a circular antenna pattern and a meta member surrounding the circular antenna pattern in a circular shape in the antenna apparatus.
Figure 9B:
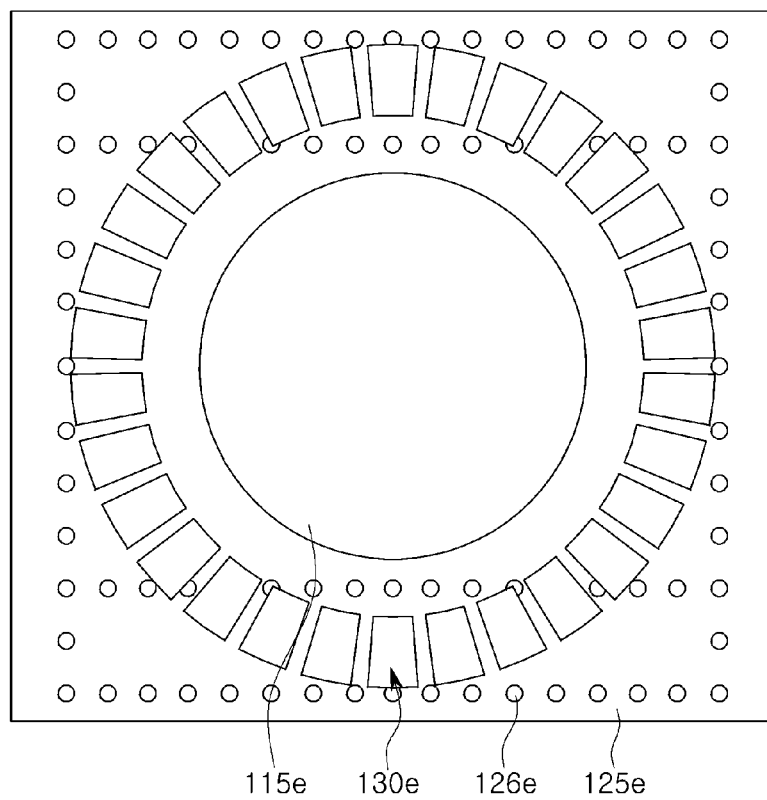

FIGS. 9A and 9B are respectively a perspective view and a plan view illustrating an example of a circular antenna pattern and a meta member surrounding the circular antenna pattern in a circular shape in the antenna apparatus.

Referring to FIGS. 9A and 9B, the antenna apparatus includes an antenna pattern 110e, an upper coupling pattern 115e, a ground pattern 125e, first shielding vias 126e, and a meta member 130e.

The antenna pattern 110e has a circular shape. Therefore, the meta member 130e surrounds the antenna pattern 110e in a circular shape when viewed in the vertical direction. For example, each of a plurality of conductive patterns included in the meta member 130e has a trapezoidal shape. Therefore, the meta member 130e further concentrates an RF signal leaking from the antenna pattern 110e in a lateral direction in the upward direction.

Figure 10A:
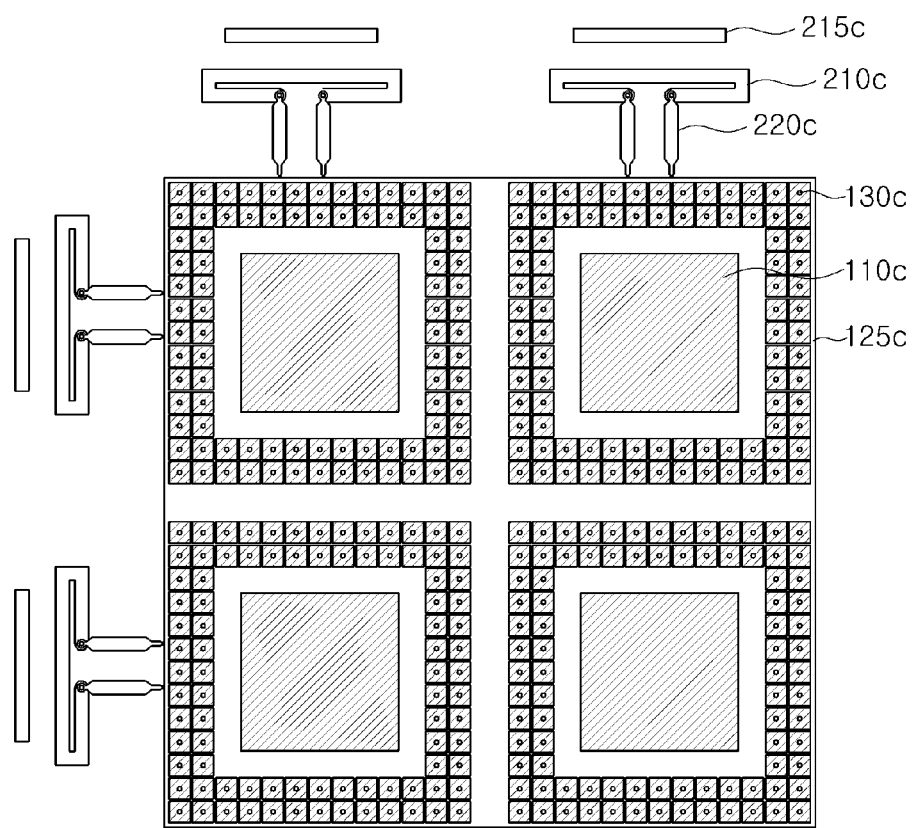
FIGS. 10A through 10C are plan views illustrating examples of an antenna module in which antenna apparatuses are arranged.
Figure 10B:
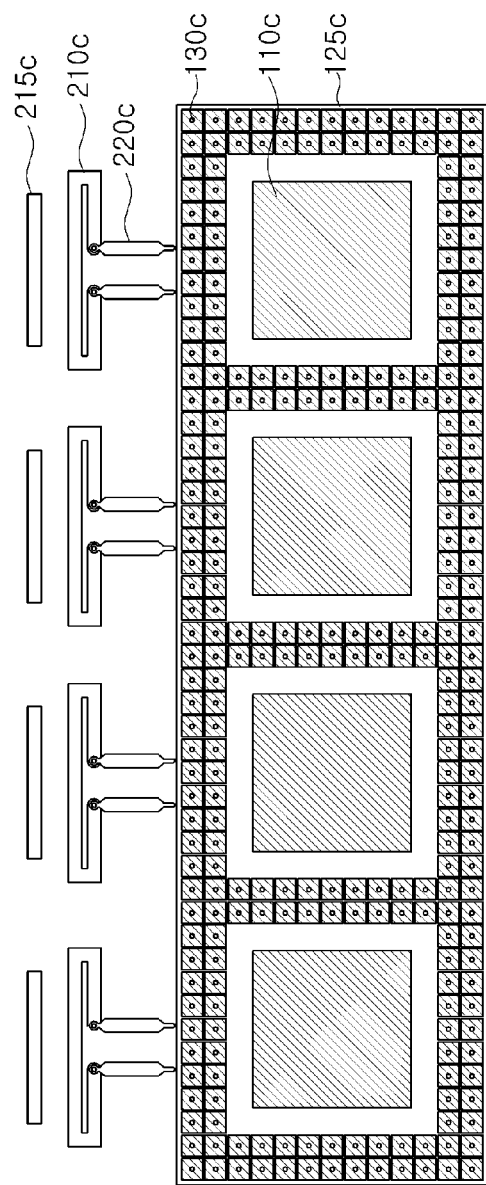
Figure 10C:
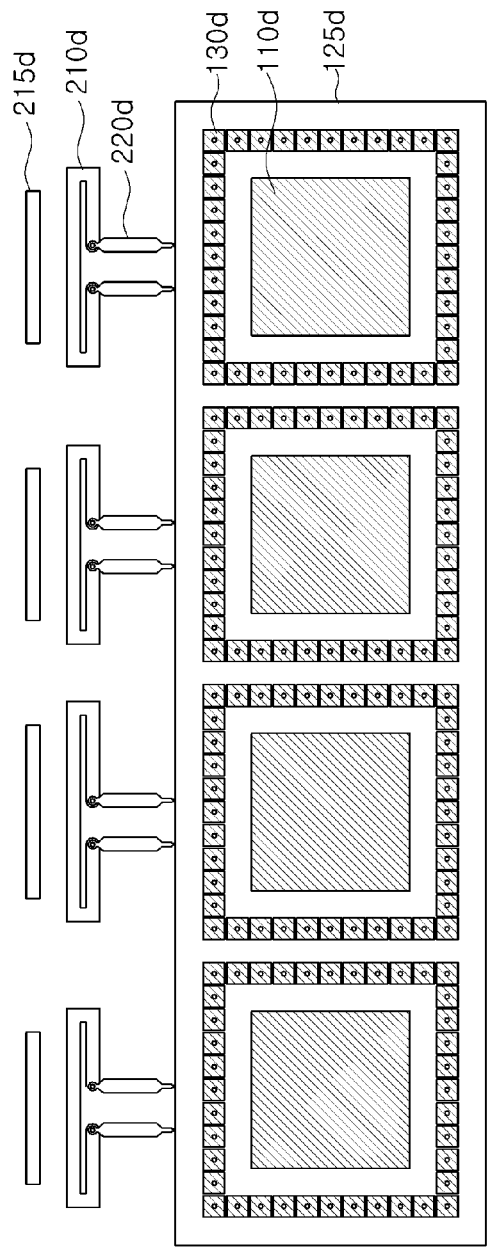

FIGS. 10A through 10C are plan views illustrating examples of an antenna module in which antenna apparatuses are arranged.

Referring to FIGS. 10A and 10B, the antenna module includes at least some of antenna patterns 110c, a ground pattern 125c, meta members 130c, second antenna patterns 210c, director patterns 215, and feed lines 220c.

The antenna pattern 110c forms a radiation pattern in a first direction (for example, an upward direction) so as to transmit or receive an RF signal in the first direction.

The second antenna pattern 210c forms a radiation pattern in a second direction (for example, a lateral direction) so as to transmit or receive an RF signal in the second direction. For example, the second antenna pattern 210c is disposed adjacent to a side surface of a connection member, and has a dipole shape or a folded dipole shape (FIGS. 10A and 10B illustrate a folded dipole shape). One end of a first pole of the second antenna pattern 210c is electrically connected to a first line of the feed line 220c, and one end of a second pole of the second antenna pattern 210c is electrically connected to a second line of the feed line 220c. A frequency band of the second antenna pattern 210c may be designed to be substantially the same as the frequency band of the antenna pattern 110c, but is not limited thereto.

In one example, the second antenna pattern 210c is disposed at a position lower than a position of the ground pattern 125c. In this example, the ground pattern 125c improves an isolation level between the second antenna pattern 210c and the antenna pattern 110c.

The director pattern 215c is electromagnetically coupled to the second antenna pattern 210c to improve either one or both of a gain and a bandwidth of the second antenna pattern 210c. The director pattern 215c has a length smaller than a total length of a dipole of the second antenna pattern 210c, and as the length of the director pattern 215c decreases, the electromagnetic coupling between the director pattern 215c and the second antenna pattern 210c increases. Therefore, either one or both of the gain and a directivity of the second antenna pattern 210c may further be improved.

The feed line 220c transfers an RF signal received from the second antenna pattern 210c to an IC, and transfers an RF signal transferred from the IC to the second antenna pattern 210c. The feed line 220c may be implemented by wirings of the connection member.

Therefore, in the antenna module of these examples, the radiation patterns are formed in the first and second directions, and the RF signal may thus be omnidirectionally transmitted and received.

In the example illustrated in FIG. 10A, the antenna apparatuses are arranged in an n×m structure, and the antenna module including these antenna apparatuses may be disposed adjacent to a vertex or corner of an electronic device in which the antenna module is mounted.

In the example illustrated in FIG. 10B, the antenna apparatuses according to an exemplary embodiment in the present disclosure may be arranged in an n×1 structure of n×1, and the antenna module including these antenna apparatuses may be disposed adjacent to a side of an electronic device in which the antenna module is mounted.

Referring to FIG. 10O, another example of the antenna module includes at least some of a plurality of antenna patterns 110d, a ground pattern 125d, a plurality of meta members 130d, a plurality of second antenna patterns 210d, a plurality of director patterns 215d, and a plurality of feed lines 220d.

Each of the plurality of meta members 130d includes a plurality of cells arranged in an n×1 structure. The plurality of meta members 130d are disposed to surround each of the plurality of antenna patterns 110d, and are spaced apart from each other. Therefore, an influence of the plurality of antenna apparatuses on one another may be reduced.

Figure 11:
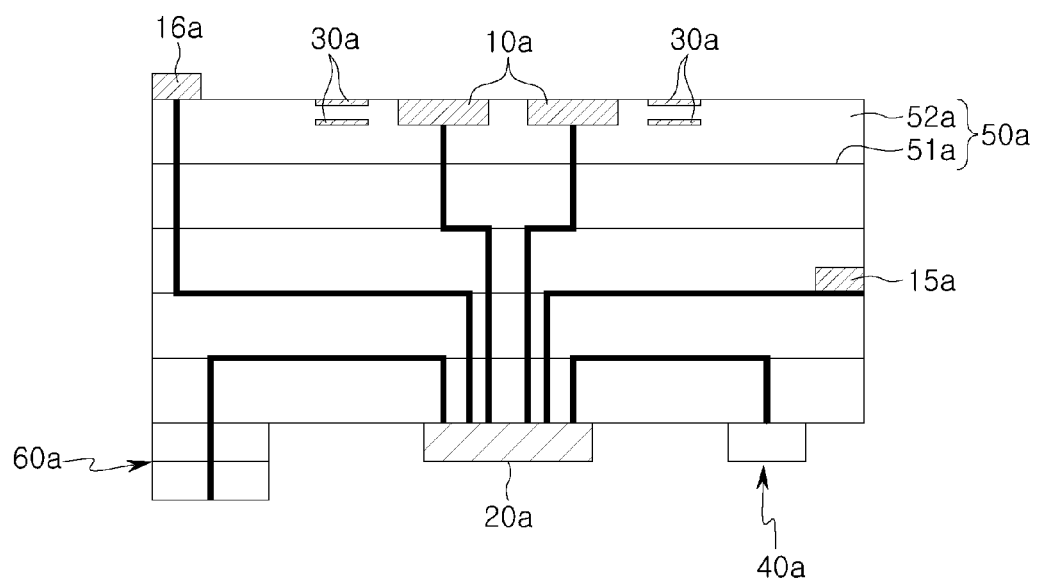
FIG. 11 is a side view illustrating an example of a schematic structure of the antenna module including the antenna apparatuses.

FIG. 11 is a side view illustrating an example of a schematic structure of the antenna module including the antenna apparatuses.

Referring to FIG. 11, the antenna module has a structure in which an antenna 10a and an IC 20a are integrated with each other, and include at least some of the antenna 10a, a second direction antenna 15a, a chip antenna 16a, the IC 20a, a meta member 30a, a passive component 40a, a board 50a, and a sub-board 60a.

The antenna 10a corresponds to the antenna pattern and the upper coupling pattern described above with reference to FIGS. 1 through 10C, and is disposed on an upper surface of the board 50a.

The meta member 30a corresponds to the meta member described above with reference to FIGS. 1 through 10C.

The second direction antenna 15a corresponds to the second antenna pattern and the director pattern described above with reference to FIGS. 10A and 10C, and is disposed adjacent to a side surface of the board 50a so as to receive the RF signal in the lateral direction.

The chip antenna 16a has a three-dimensional structure including a dielectric having a high dielectric constant higher than a dielectric constant of an insulating layer 52a and a plurality of electrodes disposed on opposite surfaces of the dielectric, and is disposed adjacent to an upper surface and a side surface of the board 50a so as to transmit and receive an RF signal in a lateral direction and/or an upward direction.

The antenna module may include at least two of the antenna 10a, the second direction antenna 15a, and the chip antenna 16a to omnidirectionally form radiation patterns.

The IC 20a converts an RF signal transferred from the antenna 10a, the second direction antenna 15a, and/or the chip antenna 16a into an intermediate frequency (IF) signal or a base band signal, and transfers the converted IF signal or base band signal to an IF IC, a base band IC, or a communications modem disposed outside the antenna module. In addition, the IC 20a converts an IF signal or a base band signal transferred from the IF IC, the base band IC, or the communications modem disposed outside the antenna module into an RF signal, and transfers the converted RF signal to the antenna 10a, the second direction antenna 15a, and/or the chip antenna 16a. A frequency (for example, 24 GHz, 28 GHz, 36 GHz, 39 GHz, or 60 GHz) of the RF signal is greater than a frequency (for example, 2 GHz, 5 GHz, or 10 GHz) of the IF signal. The IC 20a performs at least some of frequency conversion, amplification, filtering, phase control, and power generation to generate a converted signal. The antenna module may further include an IF IC or a base band IC disposed on a lower surface of the board 50a, depending on a design.

The IC 20a and the passive component 40a are disposed adjacent to the lower surface of the board 50a. The passive component 40a may be a capacitor (for example, a multi-layer ceramic capacitor (MLCC)), an inductor, or a chip resistor so as to provide a required impedance to the IC 20a.

The board 50a includes one or more conductive layers 51a and one or more insulating layers 52a, and includes one or more vias penetrating through the one or more insulating layers 52a so as to electrically connect a plurality of conductive layers 51a to each other. For example, the board 50a may be implemented by a printed circuit board, and may have a structure in which an antenna package of an upper end and a connection member of a lower end are coupled to each other. For example, the antenna package may be designed in terms of transmission and reception efficiency of the RF signal, and the connection member may be designed in terms of wiring efficiency.

For example, a conductive layer relatively close to an upper surface of the board 50a among one or more conductive layers 51a may be used as a ground pattern of the antenna 10a, and a conductive layer relatively close to the lower surface of the board 50a among one or more conductive layers 51a may be used as a wiring layer through which the RF signal, the IF signal, or the base band signal passes, a wiring ground layer for electromagnetic isolation of the wiring layer, and an IC ground layer providing a ground to the IC 20a.

The sub-board 60a is disposed on the lower surface of the board 50a, and provides a path for the IF signal or the base band signal. For example, the sub-board 60a may be implemented by a support member so as to be seated on an outer portion of the antenna module and support the antenna module.

Depending on a design, the sub-board 60a may be replaced by a connector to which a coaxial cable is connected, or may be replaced by a flexible insulating layer on which a signal transmission line electrically connecting an external board and the IC 20a to each other is disposed.

Figure 12A:
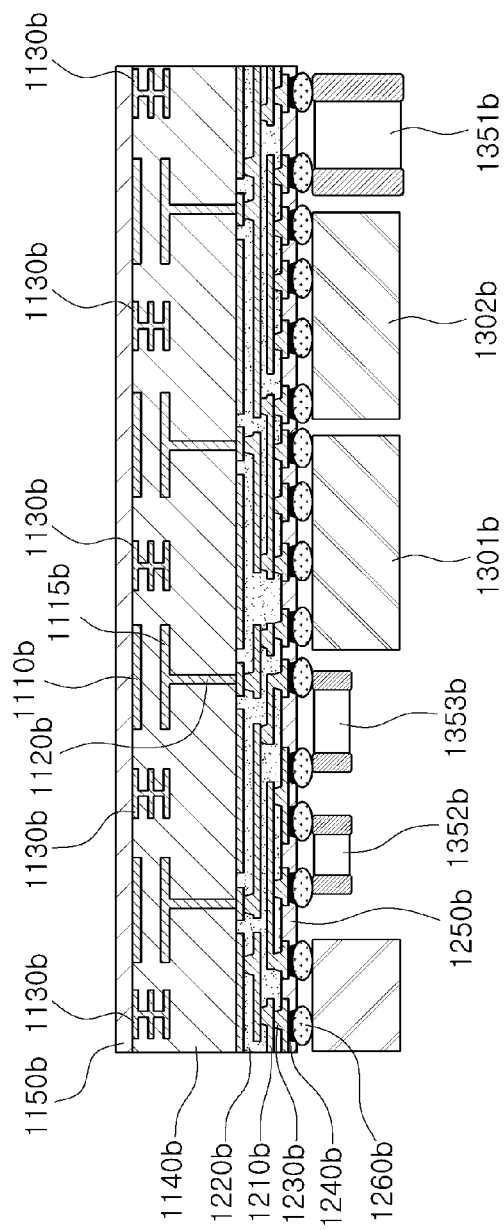
FIGS. 12A and 12B are side views illustrating examples of various structures of the antenna module including the antenna apparatuses.
Figure 12B:
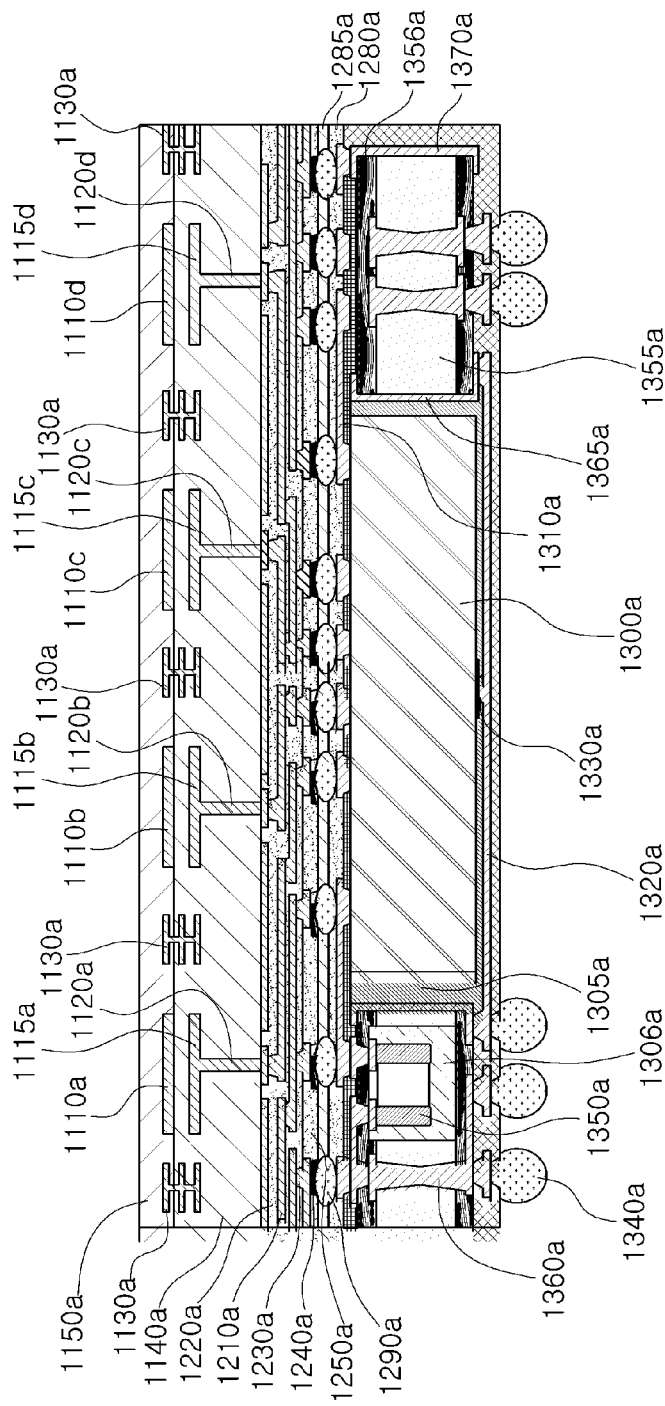

FIGS. 12A and 12B are side views illustrating examples of various structures of the antenna module including the antenna apparatuses.

Referring to FIG. 12A, the antenna module has a structure in which an antenna package and a connection member are coupled to each other.

The connection member includes at least one wiring layer 1210b and at least one insulating layer 1220b, wiring vias 1230b connected to at least one wiring layer 1210b, connection pads 1240b connected to the wiring vias 1230b, and a passivation layer 1250b, and may have a structure similar to that of a copper redistribution layer (RDL). The antenna package is disposed on an upper surface of the connection member.

The antenna package includes at least some of a plurality of upper coupling members 1110b, a plurality of antenna patterns 1115b, a plurality of feed vias 1120b, meta members 1130b, a dielectric layer 1140b, and an encapsulation member 1150b, and corresponds to the antenna apparatus described above with reference to FIGS. 1 through 11.

The dielectric layer 1140b is disposed to surround side surfaces of each of the plurality of feed vias 1120b. The dielectric layer 1140b has a height greater than a height of at least one insulating layer 1220b of the connection member. As either one or both of a height and a width of the dielectric layer 1140b increases, the antenna package becomes more advantageous in securing antenna performance, and provides boundary conditions (for example, a small manufacturing tolerance, a short electrical length, a smooth surface, and a large size of the dielectric layer, and adjustment of a dielectric constant) that are advantageous for an RF signal transmission and reception operation of the plurality of antenna patterns 1115b.

The encapsulation member 1150b is disposed on the dielectric layer 1140b, and improves a durability of the plurality of antenna patterns 1115b and/or the plurality of upper coupling members 1110b against impact and oxidation. For example, the encapsulation member 1150b may be implemented by a photoimageable encapsulant (PIE), an Ajinomoto Build-Up Film (ABF), or an epoxy molding compound (EMC), but is not limited thereto.

An IC 1301b, a power management IC (PMIC) 1302b, and a plurality of passive components 1351b, 1352b, and 1353b are disposed on a lower surface of the connection member. The IC 1301b corresponds to the IC 20a illustrated in FIG. 11. In the example illustrated in FIG. 12A, the IC 1301b, the PMIC 1302b, and the plurality of passive components 1351b, 1352b, and 1353b are coupled to the connection member through electrical connection structures 1260b.

The PMIC 1302b generates power, and transfers the generated power to the IC 1301b through at least one wiring layer 1210b of the connection member.

The plurality of passive components 1351b, 1352b, and 1353b provide impedances to either one or both of the IC 1301b and the PMIC 1302b. For example, the plurality of passive components 1351b, 1352b, and 1353b include at least some of a capacitor (for example, a multilayer ceramic capacitor (MLCC)), an inductor, and a chip resistor.

Referring to FIG. 12B, an IC package includes an IC 1300a, an encapsulant 1305a encapsulating at least portions of the IC 1300a, a support member 1355a having a first side surface disposed to face the IC 1300a, and a connection member including at least one wiring layer 1310a electrically connected to the IC 1300a and the support member 1355a and insulating layer 1280a. The IC package is coupled to either one or both of the connection member and the antenna package.

The connection member includes at least one wiring layer 1210a, at least one insulating layer 1220a, wiring vias 1230a, connection pads 1240a, and a passivation layer 1250a. An antenna package includes a plurality of upper coupling members 1110a, 1110b, 1110c, and 1110d, a plurality of antenna patterns 1115a, 1115b, 1115c, and 1115d, a plurality of feed vias 1120a, 1120b, 1120c, and 1120d, a plurality of meta members 1130a, a dielectric layer 1140a, and an encapsulation member 1150a.

The IC package is coupled to the connection member described above. An RF signal generated by the IC 1300a included in the IC package is transferred to the antenna package through at least one wiring layer 1310a and is transmitted in an upward direction of the antenna module, and a first RF signal received by the antenna package is transferred to the IC 1300a through the at least one wiring layer 1310a.

The IC package further includes connection pads 1330a disposed on an upper surface and/or a lower surface of the IC 1300a. The connection pads disposed on the upper surface of the IC 1300a are electrically connected to at least one wiring layer 1310a, and the connection pads disposed on the lower surface of the IC 1300a are electrically connected to the support member 1355a or a core plating member 1365a through a lower wiring layer 1320a. The core plating member 1365a provides a ground region for the IC 1300a.

The support member 1355a includes a core dielectric layer 1356a in contact with the connection member, and at least one core via 1360a penetrating through the core dielectric layer 1356a and electrically connected to the lower wiring layer 1320a. The at least one core via 1360a is electrically connected to an electrical connection structure 1340a such as a solder ball, a pin, or a land.

Therefore, the support member 1355a receives either one or both of a base band signal and power supplied from a lower surface thereof, and transfers the either one or both of the base band signal and the power to the IC 1300a through at least one wiring layer 1310a of the connection member.

The IC 1300a generates an RF signal in a millimeter wave (mmWave) band using the either one or both of the base band signal and the power. For example, the IC 1300a may receive a base band signal having a low frequency and perform frequency conversion, amplification, filtering, phase control, and power generation on the base band signal, and may be implemented by a compound semiconductor (for example, GaAs) or a silicon semiconductor in consideration of high frequency characteristics of the IC 1300a.

The IC package further includes a passive component 1350a electrically connected to a wiring corresponding to at least wiring layer 1310a. The passive component 1350 is disposed in an accommodation space 1306a provided by the support member 1355a, and provides an impedance to the IC 1300a. For example, the passive component 1350a may be a multilayer ceramic capacitor (MLCC), an inductor, or a chip resistor.

The IC package include core plating members 1365a and 1370a disposed on side surfaces of the support member 1355a. The core plating members 1365a and 1370a provide a ground region for the IC 1300a, and externally dissipate heat of the IC 1300a and remove noise generated by the IC 1300a.

The IC package and the connection member may be independently manufactured and then coupled to each other, or may be manufactured together with each other depending on a design. That is, a separate coupling process between the IC package and the connection member may be omitted.

In the example illustrated in FIG. 12B, the IC package is coupled to the connection member through electrical connection structures 1290a and a passivation layer 1285a, but the electrical connection structures 1290a and the passivation layer 1285a may be omitted depending on a design.

Figure 13A:
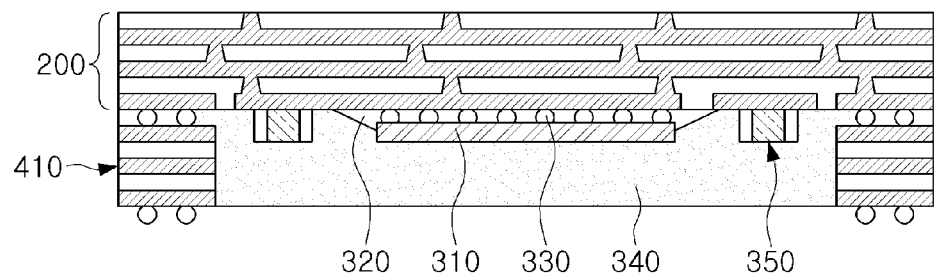
FIGS. 13A and 13B are views illustrating examples of a lower structure of a connection member of the antenna module including the antenna apparatuses.
Figure 13B:
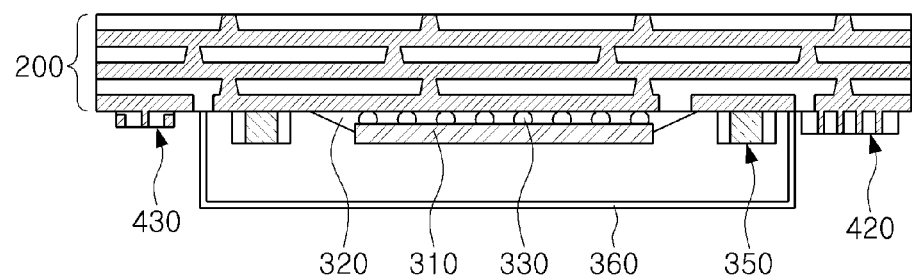

FIGS. 13A and 13B are views illustrating examples of a lower structure of a connection member of the antenna module.

Referring to FIG. 13A, the antenna module includes at least some of a connection member 200, an IC 310, an adhesive member 320, electrical connection structures 330, an encapsulant 340, a passive component 350, and a sub-board 410.

The connection member 200 has a structure similar to the structures of the connection members illustrated in FIGS. 12A and 12B. For example, the connection member 200 includes a wiring layer, a ground layer, and an IC ground layer.

The wiring layer includes a wiring through which an RF signal flows and a wiring ground pattern surrounding the wiring. The wiring electrically connects the feed vias described above with respect to FIGS. 12A and 12B and the IC 310 to each other.

The ground layer is disposed between the antenna apparatus and the wiring layer, and electromagnetically isolates the antenna apparatus and the wiring layer from each other.

The IC ground layer provides a ground needed for a circuit of the IC 310, is disposed between the wiring layer and the IC 310 to electromagnetically isolate the wiring layer and the IC 310 from each other, and includes a wiring through which an IF signal, a base band signal, or power passes.

The IC 310 may be the same as the IC described above with respect to FIGS. 11 through 12B, and is disposed below the connection member 200. The IC 310 is electrically connected to the wiring layer of the connection member 200 to transfer an RF signal to the wiring layer or receive an RF signal transferred from the wiring layer, and is electrically connected to the ground layer of the connection member 200 to receive a ground provided from the ground layer. For example, the IC 310 may perform any one or any combination of any two or more of frequency conversion, amplification, filtering, phase control, and power generation to generate a converted signal.

The adhesive member 320 adheres the IC 310 and the connection member 200 to each other.

The electrical connection structures 330 electrically connects the IC 310 and the connection member 200 to each other. For example, the electrical connection structures 330 are disposed to electrically connect the wiring layer and the ground layer of the connection member 200 to each other, and have a structure such as a solder ball, a pin, a land, or a pad. The electrical connection structures 330 have a melting point lower than the melting point of the wiring layer and the ground layer of the connection member 200 to electrically connect the IC 310 and the connection member 200 to each other by a predetermined joining process occurring at the low melting point.

The encapsulant 340 encapsulates at least portions of the IC 310, and improves heat dissipation performance and impact protection performance of the IC 310. For example, the encapsulant 340 may be implemented by a PIE, an ABF, or an EMC, but is not limited thereto.

The passive component 350 is disposed on a lower surface of the connection member 200, is electrically connected to either one or both of the wiring layer and the ground layer of the connection member 200 through the electrical connection structures 300, and corresponds to the passive components illustrated in FIGS. 11 through 12B.

The sub-board 410 is disposed below the connection member 200, and is electrically connected to the connection member 200 so as to receive an IF signal or a base band signal transferred from an external apparatus and transfer the IF signal or the base band signal to the IC 310, or receive an IF signal or a base band signal transferred from the IC 310 and transfer the IF signal or the base band signal to the external apparatus. A frequency (for example, 24 GHz, 28 GHz, 36 GHz, 39 GHz, or 60 GHz) of the RF signal is greater than a frequency (for example, 2 GHz, 5 GHz, or 10 GHz) of the IF signal.

For example, the sub-board 410 may transfer the IF signal or the base band signal to the IC 310 or receive the IF signal or the base band signal transferred from the IC 310 through a wiring included in the IC ground layer of the connection member 200.

Referring to FIG. 13B, the antenna module includes at least some of an IC 310, an adhesive member 320, electrical connection structures 330, a passive component 350, a shielding member 360, a connector 420, and a chip antenna 430.

The shielding member 360 is disposed below the connection member 200 to shield the IC 310 together with the connection member 200. For example, the shielding member 360 may be a conformal shield that covers the IC 310 and the passive component 350 together, or may be a compartment shield to cover the IC 310 and the passive component 350 separately. For example, the shielding member 360 may have a hexahedral shape with one face open, and may be coupled to the connection member 200 to form a hexahedral accommodation space. The shielding member 360 is made of a material having a high conductivity, such as copper, so that it has a short skin depth, and is electrically connected to the ground layer of the connection member 200. Therefore, the shielding member 360 reduces the amount of external electromagnetic noise that is applied to the IC 310 and the passive component 350.

The connector 420 may have a structure for connection to a cable (for example, a coaxial cable or a flexible printed circuit board (PCB)), may be electrically connected to the IC ground layer of the connection member 200, and may play a role similar to the role of the sub-board described above. That is, the connector 420 may receive an IF signal or a base band as well as power provided from the cable, or may provide either one or both of an IF signal and a base band signal to the cable.

The chip antenna 430 assists the antenna apparatus to transmit or receive an RF signal, and corresponds to the chip antenna 16a illustrated in FIG. 11.

Figure 14A:
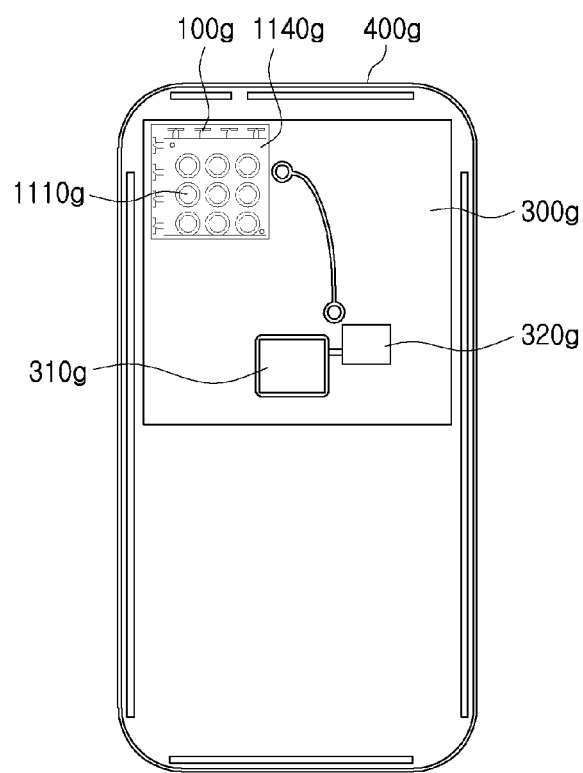
FIGS. 14A and 14B are plan views illustrating examples of a layout of the antenna module.
Figure 14B:
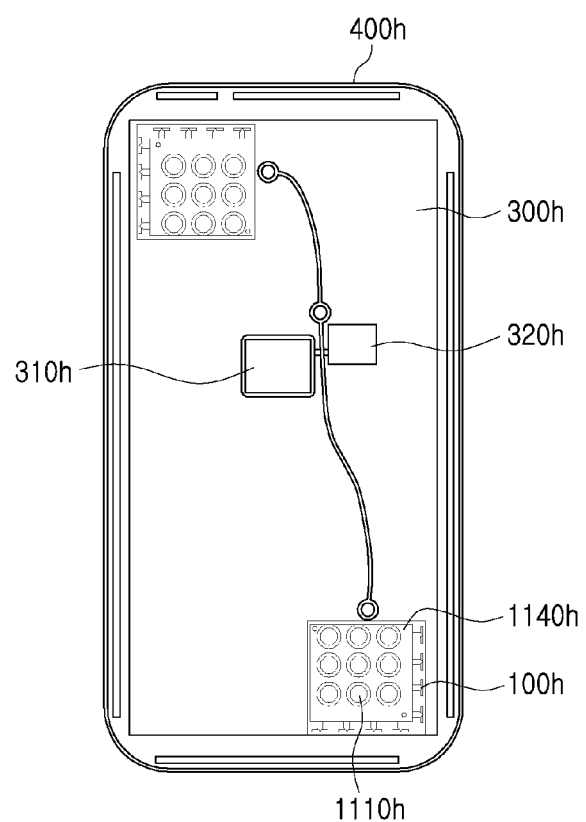

FIGS. 14A and 14B are plan views illustrating examples of a layout of the antenna module in an electronic device.

Referring to FIG. 14A, the antenna module including an antenna apparatus 100g, antenna patterns 1110g, and a dielectric layer 1140g is disposed adjacent to a side surface boundary of an electronic device 400g on a set board 300g of the electronic device 400g.

The electronic device 400g may be a smartphone, a personal digital assistant (PDA), a digital video camera, a digital still camera, a network system, a computer, a monitor, a tablet PC, a laptop PC, a netbook PC, a television, a video game machine, a smartwatch, or an automotive component, but is not limited thereto.

A communications module 310g and a base band circuit 320g are further disposed on the set board 300g. The communications module 310g includes at least some of a memory chip such as a volatile memory (for example, a dynamic random-access memory (DRAM)), a non-volatile memory (for example, a read-only memory (ROM)), or a flash memory); an application processor chip such as a central processor (for example, a central processing unit (CPU)), a graphics processor (for example, a graphics processing unit (GPU)), a digital signal processor, a cryptographic processor, a microprocessor, or a microcontroller; and a logic chip such as an analog-digital converter or an application-specific IC (ASIC), so as to perform digital signal processing.

The base band circuit 320g performs analog-digital conversion, amplification for an analog signal, filtering, and frequency conversion to generate a base band signal. The base band signal input or output from the base band circuit 320g is transferred to the antenna module through the cable.

For example, the base band signal may be transferred to the IC through the electrical connection structure, the core via, and the wiring layer. The IC converts the base band signal into an RF signal in an mmWave band.

Referring to FIG. 14B, a plurality of antenna modules each including an antenna apparatus 100h, antenna patterns 1110h, and a dielectric layer 1140h are respectively disposed adjacent to one side surface boundary and another side surface boundary of an electronic device 400h on a set board 300h of the electronic device 400h, and a communications module 310h and a base band circuit 320h are further disposed on the set board 300h.

The conductive layer, the wiring layer, the ground layer, the feed line, the feed via, the antenna pattern, the upper coupling pattern, the second antenna pattern, the meta member, the ground pattern, the first and second shielding vias, the director pattern, and the electrical connection structure described in this application are made of a metal (for example, a conductive material such as copper (Cu), aluminum (Al), silver (Ag), tin (Sn), gold (Au), nickel (Ni), lead (Pb), titanium (Ti), or an alloy of any two or more thereof), and may be formed by a plating method such as chemical vapor deposition (CVD), physical vapor deposition (PVD), sputtering, a subtractive process, an additive process, a semi-additive process (SAP), a modified semi-additive process (mSAP) but are not limited thereto.

Either one or both of the dielectric layer and the insulating layer described in this application may be implemented by FR-4, a liquid-crystal polymer (LCP), a low temperature co-fired ceramic (LTCC), a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), a prepreg, ABF, FR-4, Bismaleimide Triazine (BT), photoimageable dielectric (PID) resin, a copper-clad laminate (CCL), or a glass- or ceramic-based insulating material.

The insulating layer may fill at least portions of positions at which the conductive layer, the wiring layer, the ground layer, the feed line, the feed via, the antenna pattern, the upper coupling pattern, the second antenna pattern, the meta member, the ground pattern, the first and second shielding vias, the director pattern, and the electrical connection structure are not disposed in the antenna apparatus and the antenna module described in this application.

The RF signal referred to herein may have a format according to protocols such as Wi-Fi (Institute of Electrical and Electronics Engineers (IEEE) 802.11 family), Worldwide Interoperability for Microwave Access (WiMAX) (IEEE 802.16 family), Mobile Broadband Wireless Access (MBWA) (IEEE 802.20 family), Long-Term Evolution (LTE), Evolution-Data Optimized (EV-DO), Evolved High Speed Packet Access (HSPA+), High Speed Downlink Packet Access (HSDPA), High Speed Uplink Packet Access (HSUPA), Enhanced Data Rates for GSM Evolution (EDGE), Global System for Mobile Communications (GSM), Global Positioning System (GPS), General Packet Radio Service (GPRS), Code-Division Multiple Access (CDMA), Time-Division Multiple Access (TDMA), Digital Enhanced Cordless Telecommunications (DECT), Bluetooth, 3G, 4G, and 5G protocols, and any other wireless and wired protocols, but is not limited thereto.

In the examples described above, the antenna apparatus and the antenna module further concentrate a radiation pattern of the antenna pattern to improve an antenna performance (e.g., a transmission/reception rate, a gain, a bandwidth, or a directivity), or have a structure advantageous for miniaturization.

In addition, the antenna apparatus and the antenna module have a wide bandwidth or perform dual-band transmission and reception by extending a frequency band depending on the inherent elements of the antenna pattern.

Further, the antenna apparatus and the antenna module concentrate each of a plurality of surface currents of the antenna pattern in a dual feeding manner to further improve the antenna performance.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An antenna apparatus, comprising:
    a ground pattern;
    an antenna pattern disposed above the ground pattern and configured to either one or both of transmit and receive a radio-frequency (RF) signal; and
    a plurality of cells disposed above the ground pattern and arranged to surround the antenna pattern,
    wherein the plurality of cells comprises:
        a plurality of lowest conductive patterns spaced apart from each other, arranged above the ground pattern, and coupled with the ground pattern to form a capacitance;
        a plurality of upper conductive patterns spaced apart from each other and stacked above the plurality of lowest conductive patterns; and
        a plurality of uppermost conductive patterns spaced apart from each other,
        wherein distances between the plurality of lowest conductive patterns and the plurality of uppermost conductive patterns are shorter than distances between the plurality of lowest conductive patterns and the ground pattern.

2. The antenna apparatus of claim 1, wherein a layer including at least a portion of the plurality of upper conductive patterns is higher than a layer including the antenna pattern.

3. The antenna apparatus of claim 2, wherein distances between the plurality of lowest conductive patterns and the plurality of upper conductive patterns are shorter than distances between the plurality of lowest conductive patterns and the ground pattern.

4. The antenna apparatus of claim 1, wherein the plurality of uppermost conductive patterns are arranged above the plurality of upper conductive patterns, and are coupled with at least a portion of the plurality of upper conductive patterns to form a capacitance.

5. The antenna apparatus of claim 4, wherein a layer including the plurality of uppermost conductive patterns is higher than a layer including the antenna pattern.

6. The antenna apparatus of claim 4, further comprising an upper coupling pattern disposed above the antenna pattern and coupled with the antenna pattern to form a capacitance,
    wherein distances between the plurality of lowest conductive patterns and the plurality of upper conductive patterns are shorter than a distance between the antenna pattern and the upper coupling pattern.

7. The antenna apparatus of claim 1, wherein the antenna pattern has a patch antenna structure, and
    wherein each of areas of the plurality of cells is smaller than an area of the antenna pattern.

8. The antenna apparatus of claim 7, wherein each of the plurality of cells has a hexahedron shape.

9. The antenna apparatus of claim 1, wherein the plurality of lowest conductive patterns are not connected to the ground pattern through conductive vias.

10. The antenna apparatus of claim 1, further comprising first and second feed vias providing feed paths of the RF signal to the antenna pattern,
    wherein the first feed vias are disposed to be closer to a first side of the antenna pattern than a second side of the antenna pattern, and
    wherein the second feed vias are disposed to be closer to the second side of the antenna pattern than the first side of the antenna pattern.

11. An antenna apparatus, comprising:
    a ground pattern;
    a plurality of antenna patterns disposed above the ground pattern and configured to either one or both of transmit and receive at least one of radio-frequency (RF) signals; and
    a plurality of cells disposed above the ground pattern and arranged to form a vertically stacked region adjacent to a region where the plurality of antenna patterns are disposed, wherein the plurality of cells comprises:
- a plurality of lowest conductive patterns spaced apart from each other, arranged above the ground pattern, and coupled with the ground pattern to form a capacitance;
- a plurality of upper conductive patterns spaced apart from each other and stacked above the plurality of lowest conductive patterns; and
- a plurality of uppermost conductive patterns spaced apart from each other,
- wherein distances between the plurality of lowest conductive patterns and the plurality of uppermost conductive patterns are shorter than distances between the plurality of lowest conductive patterns and the ground pattern.

12. The antenna apparatus of claim 11, wherein a layer including at least a portion of the plurality of upper conductive patterns is higher than a layer including the plurality of antenna patterns.

13. The antenna apparatus of claim 12, wherein distances between the plurality of lowest conductive patterns and the plurality of upper conductive patterns are shorter than distances between the plurality of lowest conductive patterns and the ground pattern.

14. The antenna apparatus of claim 11, wherein the plurality of uppermost conductive patterns are arranged above the plurality of upper conductive patterns, and are coupled with at least a portion of the plurality of upper conductive patterns to form a capacitance.

15. The antenna apparatus of claim 14, wherein a layer including the plurality of uppermost conductive patterns is higher than a layer including the plurality of antenna patterns.

16. The antenna apparatus of claim 14, further comprising a plurality of upper coupling patterns disposed above the plurality of antenna patterns and coupled with the plurality of antenna patterns to form a capacitance,
- wherein distances between the plurality of lowest conductive patterns and the plurality of upper conductive patterns are shorter than a distance between the plurality of antenna patterns and the plurality of upper coupling patterns.

17. The antenna apparatus of claim 11, wherein each of areas of the plurality of cells is smaller than an area of each of the plurality of antenna patterns, and
- wherein at least one of gaps between the plurality of cells is shorter than each of lengths of the plurality of cells.

18. The antenna apparatus of claim 17, wherein each of the plurality of cells has a hexahedron shape.

19. The antenna apparatus of claim 11, wherein the plurality of lowest conductive patterns are not connected to the ground pattern through conductive vias.

20. The antenna apparatus of claim 11, further comprising:
- a plurality of first feed vias disposed to be closer to first sides of the plurality of antenna patterns than second sides of the plurality of antenna patterns; and
- a plurality of second feed vias disposed to be closer to the second sides of the plurality of antenna patterns than the first sides of the plurality of antenna patterns.

* * * * *